United States Patent
Ohashi et al.

(10) Patent No.: US 9,916,981 B2
(45) Date of Patent: Mar. 13, 2018

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: Kabushiki Kaisha Toshiba, Minato-ku (JP)

(72) Inventors: Teruyuki Ohashi, Kawasaki (JP); Hiroshi Kono, Himeji (JP); Souzou Kanie, Himeji (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/430,769

(22) Filed: Feb. 13, 2017

(65) Prior Publication Data
US 2018/0025910 A1    Jan. 25, 2018

(30) Foreign Application Priority Data
Jul. 22, 2016    (JP) .................................. 2016-144515

(51) Int. Cl.
*H01L 29/417*    (2006.01)
*H01L 21/04*    (2006.01)
(Continued)

(52) U.S. Cl.
CPC ........ *H01L 21/047* (2013.01); *H01L 29/0646* (2013.01); *H01L 29/0865* (2013.01);
(Continued)

(58) Field of Classification Search
CPC ............... H01L 21/047; H01L 29/0646; H01L 29/0865; H01L 29/0869; H01L 29/1608;
(Continued)

(56) References Cited

U.S. PATENT DOCUMENTS 9,786,741 B2 * 10/2017 Masuda .............. H01L 29/1608
9,786,742 B2 * 10/2017 Suzuki ................ H01L 29/1608
(Continued)

FOREIGN PATENT DOCUMENTS

| JP | 2009-260253 | 11/2009 | |
| JP | 2014-38988 | 2/2014 | |
| JP | 2017055011 A | * 3/2017 | ......... H01L 29/7802 |

*Primary Examiner* — Earl Taylor
(74) *Attorney, Agent, or Firm* — Oblon, McClelland, Maier & Neustadt, L.L.P.

(57) ABSTRACT

A semiconductor device according to an embodiment includes a SiC layer having a first and a second plane; a first electrode having a first region in the SiC layer, the inclination angle of a side surface of the first region being 60 to 85 degrees; a second electrode; a first gate electrode; a second gate electrode facing the first gate electrode; first and second gate insulating layers; a first region of a first conductivity type in the SiC layer; a second region of a second conductivity type between the first region and the first gate insulating layer; a third region of the second conductivity type between the first region and the second gate insulating layer; a sixth region of the second conductivity type between the first region and the first region; and a seventh region of the second conductivity type between the first region and the sixth region.

19 Claims, 21 Drawing Sheets

(51) Int. Cl.
  *H01L 29/16* (2006.01)
  *H01L 29/08* (2006.01)
  *H01L 29/06* (2006.01)
  *H01L 29/78* (2006.01)
  *H01L 29/66* (2006.01)
  *H01L 29/167* (2006.01)

(52) U.S. Cl.
  CPC ........ *H01L 29/0869* (2013.01); *H01L 29/167* (2013.01); *H01L 29/1608* (2013.01); *H01L 29/41741* (2013.01); *H01L 29/66068* (2013.01); *H01L 29/7813* (2013.01); *H01L 29/41766* (2013.01); *H01L 29/41775* (2013.01)

(58) Field of Classification Search
  CPC ............. H01L 29/167; H01L 29/41741; H01L 29/66068; H01L 29/7813
  See application file for complete search history.

(56) References Cited

U.S. PATENT DOCUMENTS

| | | | |
|---|---|---|---|
| 2011/0024831 A1* | 2/2011 | Nakano | H01L 29/0623 257/330 |
| 2013/0001592 A1* | 1/2013 | Miyahara | H01L 29/4236 257/77 |
| 2015/0214355 A1* | 7/2015 | Nakano | H01L 29/41766 257/330 |
| 2017/0012108 A1* | 1/2017 | Sakakibara | H01L 21/2033 |
| 2017/0077285 A1* | 3/2017 | Uehara | H01L 29/7802 |

* cited by examiner

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is based upon and claims the benefit of priority from Japanese Patent Application No. 2016-144515, filed on Jul. 22, 2016, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) is expected to be used as a material for a next-general semiconductor device. SiC has better physical properties than silicon (Si). For example, SiC has a bandgap that is three times wider than that of Si, a breakdown field strength that is about ten times higher than that of Si, and a thermal conductivity that is about three times higher than that of Si. These physical properties are used to achieve a semiconductor device which has low loss and can operate at a high temperature.

However, for example, when silicon carbide is used to form a metal insulator semiconductor (MIS) structure, there is a concern that the breakdown voltage of a gate insulating layer will become lower than the breakdown voltage of a semiconductor, since the breakdown voltage of silicon carbide is high. In particular, when the MIS structure is formed in a trench in order to increase an integrity of a device, the breakdown voltage of the gate insulating layer is reduced due to the concentration of the electric field at the bottom of the trench.

DETAILED DESCRIPTION

Figure 1:
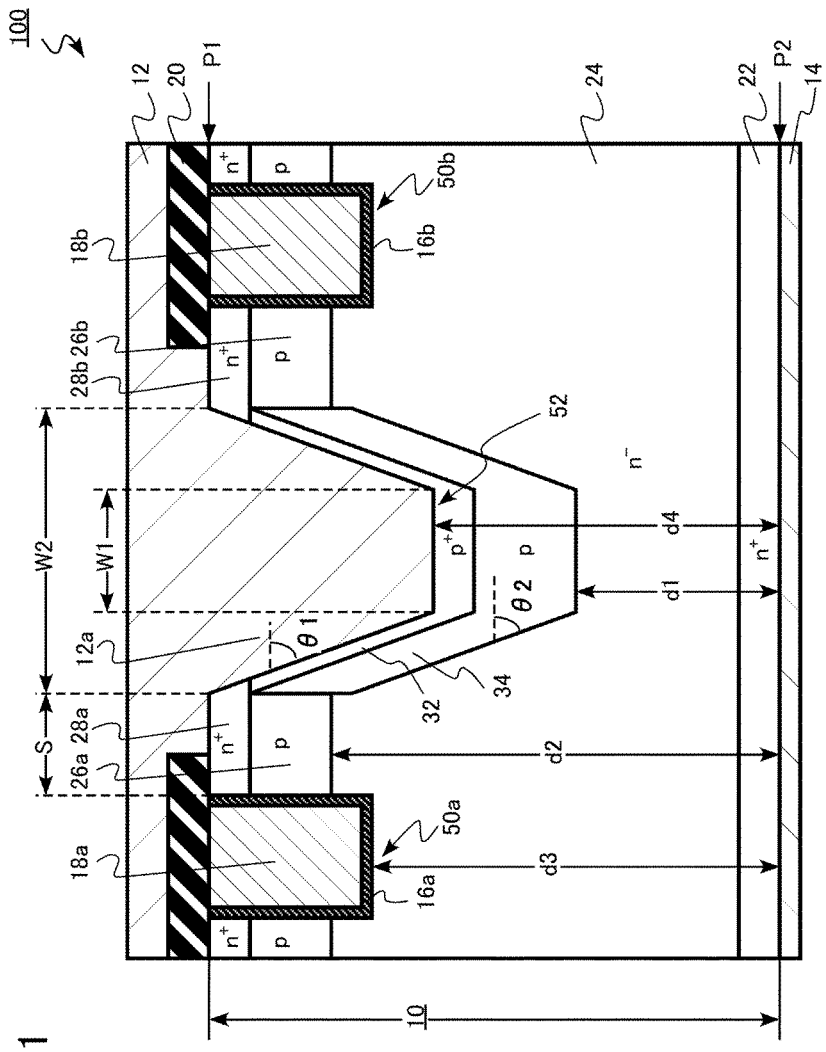
FIG. 1 is a cross-sectional view schematically illustrating a semiconductor device according to a first embodiment.

A semiconductor device according to an embodiment includes a silicon carbide layer having a first plane and a second plane; a first electrode having a first region provided in the silicon carbide layer, a width of a second-plane-side end portion of the first region being less than a width of a first-plane-side end portion of the first region, a first inclination angle of a side surface of the first region with respect to a plane parallel to the first plane being equal to or greater than 60 degrees and equal to or less than 85 degrees; a second electrode facing the first electrode, the silicon carbide layer being interposed between the second electrode and the first electrode; a first gate electrode; a second gate electrode facing the first gate electrode, the first region being interposed between the second gate electrode and the first gate electrode; a first gate insulating layer which is provided between the first region and the first gate electrode; a second gate insulating layer which is provided between the first region and the second gate electrode; a first silicon carbide region of a first conductivity type which is provided in the silicon carbide layer; a second silicon carbide region of a second conductivity type which is provided between the first silicon carbide region and the first plane and between the first region and the first gate insulating layer; a third silicon carbide region of the second conductivity type which is provided between the first silicon carbide region and the first plane and between the first region and the second gate insulating layer; a fourth silicon carbide region of the first conductivity type which is provided between the second silicon carbide region and the first plane; a fifth silicon carbide region of the first conductivity type which is provided between the third silicon carbide region and the first plane and faces the fourth silicon carbide region, with the first region interposed therebetween; a sixth silicon carbide region of the second conductivity type which is provided between the second-plane-side end portion of the first region and the first silicon carbide region and between the side surface of the first region and the first silicon carbide region and has a higher second-conductivity-type impurity concentration than the second silicon carbide region and the third silicon carbide region; and a seventh silicon carbide region of the second conductivity type which is provided between the first silicon carbide region and the sixth silicon carbide region and has a lower second-conductivity-type impurity concentration than the sixth silicon carbide region, a distance between the seventh silicon carbide region and the second plane being less than a distance between the second plane and the second silicon carbide region and a distance between the second plane and the third silicon carbide region.

Hereinafter, embodiments of the invention will be described with reference to the drawings. In the following description, the same or similar members are denoted by the same reference numerals and the description thereof will not be repeated.

In the following description, $n^+$, n, $n^-$, $p^+$, p, and $p^-$ indicate the relative levels of impurity concentration in each conductivity type. That is, $n^+$ indicates an n-type impurity concentration which is higher than that of n and $n^-$ indicates an n-type impurity concentration which is lower than that of n. In addition, $p^+$ indicates a p-type impurity concentration which is higher than that of p and $p^-$ indicates a p-type impurity concentration which is lower than that of p. In some cases, an $n^+$ type and an $n^-$ type are simply referred to as an n type and a $p^+$ type and a $p^-$ type are simply referred to as a p type.

First Embodiment

A semiconductor device according to this embodiment includes a silicon carbide layer having a first plane and a second plane; a first electrode having a first region provided in the silicon carbide layer, a width of a second-plane-side end portion of the first region being less than a width of a first-plane-side end portion of the first region, a first inclination angle of a side surface of the first region with respect to a plane parallel to the first plane being equal to or greater than 60 degrees and equal to or less than 85 degrees; a second electrode which faces the first electrode, with the silicon carbide layer interposed therebetween; a first gate electrode; a second gate electrode which faces the first gate electrode, with the first region interposed therebetween; a first gate insulating layer which is provided between the first region and the first gate electrode; a second gate insulating layer which is provided between the first region and the second gate electrode; a first silicon carbide region of a first conductivity type which is provided in the silicon carbide layer; a second silicon carbide region of a second conductivity type which is provided between the first silicon carbide region and the first plane and between the first region and the first gate insulating layer; a third silicon carbide region of the second conductivity type which is provided between the first silicon carbide region and the first plane and between the first region and the second gate insulating layer; a fourth silicon carbide region of the first conductivity type which is provided between the second silicon carbide region and the first plane; a fifth silicon carbide region of the first conductivity type which is provided between the third silicon carbide region and the first plane and faces the fourth silicon carbide region, with the first region interposed therebetween; a sixth silicon carbide region of the second conductivity type which is provided between the second-plane-side end portion of the first region and the first silicon carbide region and between the side surface of the first region and the first silicon carbide region and has a higher second-conductivity-type impurity concentration than the second silicon carbide region and the third silicon carbide region; and a seventh silicon carbide region of the second conductivity type which is provided between the first silicon carbide region and the sixth silicon carbide region and has a lower second-conductivity-type impurity concentration than the sixth silicon carbide region, a distance between the seventh silicon carbide region and the second plane being less than a distance between the second plane and the second silicon carbide region and a distance between the second plane and the third silicon carbide region.

FIG. 1 is a cross-sectional view schematically illustrating the semiconductor device according to this embodiment. A metal oxide semiconductor field effect transistor (MOSFET) 100 is, for example, a double implantation MOSFET (DIMOSFET) in which a well region and a source region are formed by ion implantation. In addition, the MOSFET 100 is a trench gate MOSFET in which a gate insulating layer and a gate electrode are provided in a trench. Furthermore, the MOSFET 100 is a double trench MOSFET in which a portion of a source electrode is provided in a trench.

FIG. 1 is a cross-sectional view illustrating a portion of the MOSFET 100. The MOSFET 100 has a structure in which a pattern illustrated in FIG. 1 is repeatedly arranged.

Hereinafter, an example in which a first conductivity type is an n type and a second conductivity type is a p type will be described. The MOSFET 100 is an n-type MOSFET having electrons as carriers.

The MOSFET 100 includes a silicon carbide layer (SiC layer) 10, a source electrode 12, a drain electrode 14, a first gate insulating layer 16a, a second gate insulating layer 16b, a first gate electrode 18a, a second gate electrode 18b, an interlayer insulating film 20, a first gate trench 50a, a second gate trench 50b, and a contact trench 52. The SiC layer 10 includes a SiC substrate 22, a drift region (first silicon carbide region) 24, a first p well region (second silicon carbide region) 26a, a second p well region (third silicon carbide region) 26b, a first source region (fourth silicon carbide region) 28a, a second source region (fifth silicon carbide region) 28b, a contact region (sixth silicon carbide region) 32, and an electric field reducing region (seventh silicon carbide region) 34.

The SiC layer 10 is, for example, a 4H-SiC single-crystal layer.

SiC can have a plurality of crystal forms. Examples of SiC include 4H-SiC which is a hexagonal crystal system, 6H-SiC which is a hexagonal crystal system, and 3C-SiC which is a cubic crystal system. The arrangement of atoms in SiC can be observed by, for example, a transmission electron microscope (TEM) to identify the crystal form of SiC. In addition, the arrangement of atoms in SiC can be observed by, for example, X-ray diffraction (XRD) to identify the crystal form of SiC.

The SiC layer 10 has a first plane and a second plane. In FIG. 1, the first plane is an upper plane and the second plane is a lower plane. Hereinafter, the first plane is referred to as a front surface and the second plane is referred to as a rear surface. The SiC layer 10 is interposed between the source electrode 12 and the drain electrode 14.

An example in which the first plane is inclined at an angle that is equal to or greater than 0 degrees and equal to or less than 8 degrees with respect to a (0001) face and the second plane is inclined at an angle that is equal to or greater than 0 degrees and equal to or less than 8 degrees with respect to a (000-1) face will be described. The (0001) face is referred to as a silicon face. The (000-1) face is referred to as a carbon face.

The source electrode 12 is provided on the front surface of the SiC layer 10. The source electrode 12 includes a trench source region (first region) 12a that is buried in the contact trench 52. The trench source region 12a is provided so as to come into contact with the side and bottom of the contact trench 52. The trench source region 12a is provided in the SiC layer 10.

In other words, a recess is provided in the front surface of the SiC layer 10. The source electrode 12 has a protrusion. A side surface of the protrusion of the source electrode 12 comes into contact with the inner side of the recess.

The width ("W1" in FIG. 1) of a second-plane-side end portion of the trench source region 12a is less than the width ("W2" in FIG. 1) of a first-plane-side end portion of the trench source region 12a. A first inclination angle ("θ1" in FIG. 1) of the side surface of the trench source region 12a with respect to a plane parallel to the first plane is equal to or greater than 60 degrees and equal to or less than 85 degrees. When the first inclination angle of the side surface of the trench source region 12a is not constant, for example, a first inclination angle at the depth of an intermediate position between the first plane and the second-plane-side end portion of the trench source region 12a is used as a representative value of the first inclination angle of the side surface of the trench source region 12a.

The width ("W1" in FIG. 1) of the second-plane-side end portion of the trench source region 12a is, for example, equal to or greater than 0.4 μm and equal to or less than 1.2 μm. The width ("W2" in FIG. 1) of the first-plane-side end portion of the trench source region 12a is, for example, equal to or greater than 0.6 μm and equal to or less than 1.4 μm. The depth of the trench source region 12a is, for example, equal to or greater than 0.4 μm and equal to or less than 1.2 μm.

In the specification, the "depth" means the distance from the front surface of the SiC layer 10.

The distance ("S" in FIG. 1) between the trench source region 12a and the first gate insulating layer 16a is, for example, equal to or greater than 0.1 μm and equal to or less than 0.8 μm. In other words, the distance ("S" in FIG. 1) between the first gate insulating layer 16a and a first contact point between a side surface of the trench source region 12a which is close to the first gate insulating layer 16a and a first plane P1 is, for example, equal to or greater than 0.1 μm and equal to or less than 0.8 μm.

The distance between the trench source region 12a and the second gate insulating layer 16b is, for example, equal to or greater than 0.1 μm and equal to or less than 0.8 μm. In other words, the distance between the second gate insulating layer 16b and a second contact point between a side surface of the trench source region 12a which is close to the second gate insulating layer 16b and the first plane P1 is, for example, equal to or greater than 0.1 μm and equal to or less than 0.8 μm.

The source electrode 12 is electrically connected to the first source region 28a, the second source region 28b, and the contact region 32. The source electrode 12 comes into contact with the first source region 28a, the second source region 28b, and the contact region 32. The source electrode 12 has a function of applying potential to the first source region 28a, the second source region 28b, and the contact region 32.

The source electrode 12 is made of metal. The metal forming the source electrode 12 has, for example, a stacked structure of titanium (Ti) and aluminum (Al). The metal forming the source electrode 12 may react with the SiC layer 10 to form metal silicide or metal carbide.

The drain electrode 14 is provided on the rear surface of the SiC layer 10. The drain electrode 14 is electrically connected to the SiC substrate 22. The drain electrode 14 is stacked on the rear surface side of the SiC layer 10.

The drain electrode 14 is made of metal. The metal forming the drain electrode 14 is, for example, nickel silicide.

The SiC substrate 22 is made of $n^+$ SiC. The SiC substrate 22 includes, for example, nitrogen (N) as n-type impurities. The n-type impurity concentration of the SiC substrate 22 is, for example, equal to or greater than $1\times10^{18}$ cm$^{-3}$ and equal to or less than $1\times10^{21}$ cm$^{-3}$.

The n-type impurity concentration of the SiC substrate 22 in the second plane is preferably equal to or greater than $1\times10^{19}$ cm$^{-3}$ and more preferably equal to or greater than $1\times10^{20}$ cm$^{-3}$ in order to reduce the contact resistance between the drain electrode 14 and the SiC substrate 22.

The drift region 24 is provided on the SiC substrate 22. The drift region 24 is, for example, an $n^-$ SiC region that is formed on the SiC substrate 22 by epitaxial growth. The thickness of the drift region 24 is, for example, equal to or greater than 5 μm and equal to or less than 150 μm.

The drift region 24 includes, for example, nitrogen (N) as n-type impurities. The n-type impurity concentration of the drift region 24 is lower than the n-type impurity concentration of the SiC substrate 22. The n-type impurity concentration of the drift region 24 is, for example, equal to or greater than $1\times10^{14}$ cm$^{-3}$ and equal to or less than $5\times10^{17}$ cm$^{-3}$.

The first p well region 26a and the second p well region 26b are provided between the drift region 24 and the first plane. The first p well region 26a and the second p well region 26b are made of p-type SiC.

The first p well region 26a is provided between the first source region 28a and the drift region 24. The second p well region 26b is provided between the second source region 28b and the drift region 24.

The first p well region 26a is provided between the trench source region 12a and the first gate insulating layer 16a. The second p well region 26b is provided between the trench source region 12a and the second gate insulating layer 16b.

The first p well region 26a and the second p well region 26b function as the channel regions of the MOSFET 100.

The first p well region 26a and the second p well region 26b are made of p-type SiC. The first p well region 26a and the second p well region 26b include, for example, aluminum (Al) as p-type impurities. The p-type impurity concentration of the first p well region 26a and the second p well region 26b is, for example, equal to or greater than $5 \times 10^{15}$ cm$^{-3}$ and equal to or less than $1 \times 10^{18}$ cm$^{-3}$.

The distance between the top and the bottom of the first p well region 26a is, for example, equal to or greater than 0.2 µm and equal to or less than 0.6 µm. The distance between the top and the bottom of the second p well region 26b is, for example, equal to or greater than 0.2 µm and equal to or less than 0.6 µm.

The first source region 28a is provided between the first p well region 26a and the first plane. The second source region 28b is provided between the second p well region 26b and the first plane of the SiC layer 10. The trench source region 12a is interposed between the first source region 28a and the second source region 28b.

The first source region 28a and the second source region 28b are made of n$^+$ SiC. The first source region 28a and the second source region 28b include, for example, phosphorus (P) as n-type impurities.

The n-type impurity concentration of the first source region 28a and the second source region 28b is higher than the n-type impurity concentration of the drift region 24. The n-type impurity concentration of the first source region 28a and the second source region 28b is, for example, equal to or greater than $1 \times 10^{19}$ cm$^{-3}$ and equal to or less than $1 \times 10^{21}$ cm$^{-3}$.

It is preferable that then-type impurity concentration of the first source region 28a and the second source region 28b in the first plane be equal to or greater than $1 \times 10^{20}$ cm$^{-3}$ in order to reduce the contact resistance between the source electrode 12 and the first and second source regions 28a and 28b.

The depth of the first source region 28a and the second source region 28b is less than the depth of the bottom of the first p well region 26a and the second p well region 26b and is, for example, equal to or greater than 0.05 µm and equal to or less than 0.5 µm.

The first gate trench 50a and the second gate trench 50b are provided in the SiC layer 10 so as to extend from the first plane to the second plane of the SiC layer 10. The depth of the first gate trench 50a and the second gate trench 50b is greater than the depth of the first p well region 26a and the second p well region 26b. The depth of the first gate trench 50a and the second gate trench 50b is, for example, equal to or greater than 0.4 µm and equal to or less than 1.0 µm.

The first gate insulating layer 16a is provided in the first gate trench 50a. The first gate electrode 18a is provided on the first gate insulating layer 16a in the first gate trench 50a.

The first gate insulating layer 16a is provided between the trench source region 12a and the first gate electrode 18a.

The second gate insulating layer 16b is provided in the second gate trench 50b. The second gate electrode 18b is provided on the second gate insulating layer 16b in the second gate trench 50b.

The second gate insulating layer 16b is provided between the trench source region 12a and the second gate electrode 18b.

Each of the first gate insulating layer 16a and the second gate insulating layer 16b is, for example, a silicon oxide film. The thickness of the first gate insulating layer 16a and the second gate insulating layer 16b is, for example, equal to or greater than 40 nm and equal to or less than 60 nm.

The trench source region 12a is interposed between the first gate electrode 18a and the second gate electrode 18b.

The first gate electrode 18a and the second gate electrode 18b are made of, for example, polysilicon including n-type impurities or p-type impurities.

The contact region 32 is provided so as to come into contact with the side and bottom of the contact trench 52. The contact region 32 comes into contact with the side surface of the trench source region 12a and the second-plane-side end portion of the trench source region 12a. The top of the contact region 32 comes into contact with, for example, the first source region 28a and the second source region 28b.

The contact region 32 is made of p$^+$ SiC. The contact region 32 includes, for example, aluminum (Al) as p-type impurities.

The p-type impurity concentration of the contact region 32 is higher than the p-type impurity concentration of the first p well region 26a and the second p well region 26b. The p-type impurity concentration of the contact region 32 is, for example, equal to or greater than $1 \times 10^{19}$ cm$^{-3}$ and equal to or less than $1 \times 10^{21}$ cm$^{-3}$.

The electric field reducing region 34 is provided around the contact trench 52. The electric field reducing region 34 is provided between the drift region 24 and the contact region 32.

The second inclination angle ("θ2" in FIG. 1) of the boundary between the electric field reducing region 34 and the drift region 24 with respect to the plane parallel to the first plane is, for example, equal to or greater than 60 degrees and equal to or less than 85 degrees. In addition, when the second inclination angle of the boundary between the electric field reducing region 34 and the drift region 24 is not constant, for example, a second inclination angle at the depth of the same position as the second-plane-side end portion of the trench source region 12a is used as a representative value of the second inclination angle of the side surface of the trench source region 12a.

The distance ("d1" in FIG. 1) between the second plane and the electric field reducing region 34 is less than the distance ("d2" in FIG. 1) between the second plane and the first p well region 26a and the distance between the second plane and the second p well region 26b. In other words, the depth of the electric field reducing region 34 is greater than the depth of the first p well region 26a and the second p well region 26b.

The distance ("d1" in FIG. 1) between the second plane and the electric field reducing region 34 is less than the distance ("d3" in FIG. 1) between the second plane and the first gate insulating layer 16a and the distance between the second plane and the second gate insulating layer 16b. In other words, the depth of the electric field reducing region 34 is greater than the depth of the first gate trench 50a and the second gate trench 50b.

The electric field reducing region 34 comes into contact with the first p well region 26a and the second p well region 26b.

The electric field reducing region 34 is made of p-type SiC. The electric field reducing region 34 includes, for example, aluminum (Al) as p-type impurities.

The p-type impurity concentration of the electric field reducing region 34 is lower than the p-type impurity concentration of the contact region 32. The p-type impurity concentration of the electric field reducing region 34 is, for example, equal to or greater than $2 \times 10^{17}$ cm$^{-3}$ and equal to or less than $2 \times 10^{18}$ cm$^{-3}$.

The p-type impurity concentration of the electric field reducing region 34 is higher than, for example, the p-type impurity concentration of the first p well region 26a and the second p well region 26b. For example, the p-type impurity concentration of the electric field reducing region 34 is equal to or more than two times the p-type impurity concentration of the first p well region 26a and the second p well region 26b.

The difference between the distance ("d4" in FIG. 1) between the second plane and the trench source region 12a and the distance ("d1" in FIG. 1) between the second plane and the electric field reducing region 34 is, for example, equal to or less than 1 μm.

The interlayer insulating film 20 is provided on the gate electrode 18. The interlayer insulating film 20 is, for example, a silicon oxide film.

The concentration and distribution of impurities included in the SiC layer 10 can be measured by, for example, a secondary ion mass spectroscopy (SIMS). In addition, the relative level of impurity concentration can be determined from the level of carrier concentration which is calculated by, for example, scanning capacitance microscopy (SCM). For example, the depth of regions including impurities and the distance between the regions can be calculated by, for example, SIMS. For example, the distance between the region including impurities and the gate insulating layer can be calculated from a composite image of an SCM image and an atomic force microscope (AFM) image.

A method for manufacturing a semiconductor device according to this embodiment includes: forming a second region of a second conductivity type in a silicon carbide layer including a first region of a first conductivity type and having a first plane and a second plane; forming two first trenches in the first plane of the silicon carbide layer so as to be deeper than the second region; forming a second trench in the first plane of the silicon carbide layer between the two first trenches, using a mask member covering the two first trenches as a mask, such that the second trench is deeper than the second region and an inclination angle of a side surface thereof with respect to the first plane is equal to or greater than 60 degrees and equal to or less than 85 degrees; implanting ions from the side and bottom of the second trench at an angle of 1 degree or less with respect to a line normal to the first plane to form a third region of the second conductivity type; implanting ions from the side and bottom of the second trench at an angle of 1 degree or less with respect to the line normal to the first plane to form a fourth region of the second conductivity type lower than the third region and having a higher second-conductivity-type impurity concentration than the third region; forming a gate insulating layer in the first trench; forming a gate electrode on the gate insulating layer in the first trench; forming a first electrode filling the second trench; and forming a second electrode on the second plane.

Hereinafter, an example of the semiconductor device manufacturing method according to this embodiment will be described. FIGS. 2 to 6 are cross-sectional views schematically illustrating the semiconductor device which is being manufactured in the semiconductor device manufacturing method according to this embodiment.

First, an n-type SiC substrate having a first plane which is a silicon face and a second plane which is a carbon face is prepared. The SiC substrate becomes the SiC substrate 22. The n-type SiC substrate is a 4H-SiC substrate.

Then, the n$^-$ drift region (first region) 24 is formed on the first plane of the n-type SiC substrate by an epitaxial growth method. The SiC substrate and the n$^-$ drift region 24 form the SiC layer 10.

Then, aluminum (Al) ions which are p-type impurity ions are selectively implanted into the drift region 24 by photolithography and an ion implantation method. The p well region (second region) 26 is formed by the ion implantation.

Figure 2:
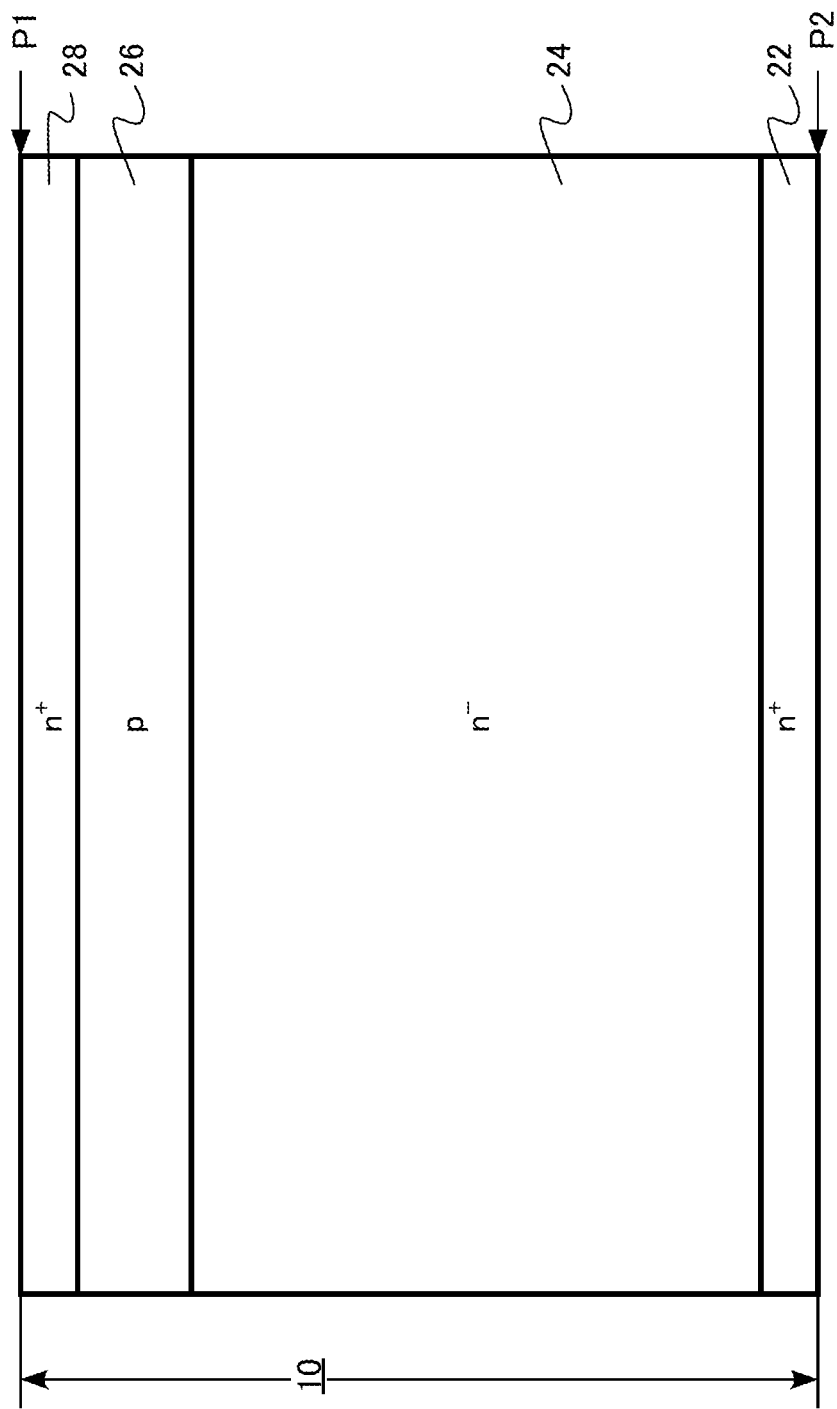
FIG. 2 is a cross-sectional view schematically illustrating the semiconductor device that is being manufactured in a semiconductor device manufacturing method according to the first embodiment.

Then, phosphorus (P) ions which are n-type impurity ions are selectively implanted into the p well region 26 by photolithography and an ion implantation method. An n$^+$ source region 28 is formed by the ion implantation (FIG. 2).

Then, two trenches, that is, the first gate trench (first trench) 50a and the second gate trench (second trench) 50b are formed in the first plane of the SiC layer 10. The first gate trench 50a and the second gate trench 50b are formed by, for example, anisotropic dry etching using a patterned mask member as a mask. The depth of the first gate trench 50a and the second gate trench 50b is greater than the depth of the p well region 26.

Then, a mask member 54 that covers at least the first gate trench 50a and the second gate trench 50b is formed. The mask member 54 is formed by, for example, the deposition of a film by a vapor deposition method, lithography, and dry etching. The mask member 54 is, for example, a silicon oxide film.

Figure 3:
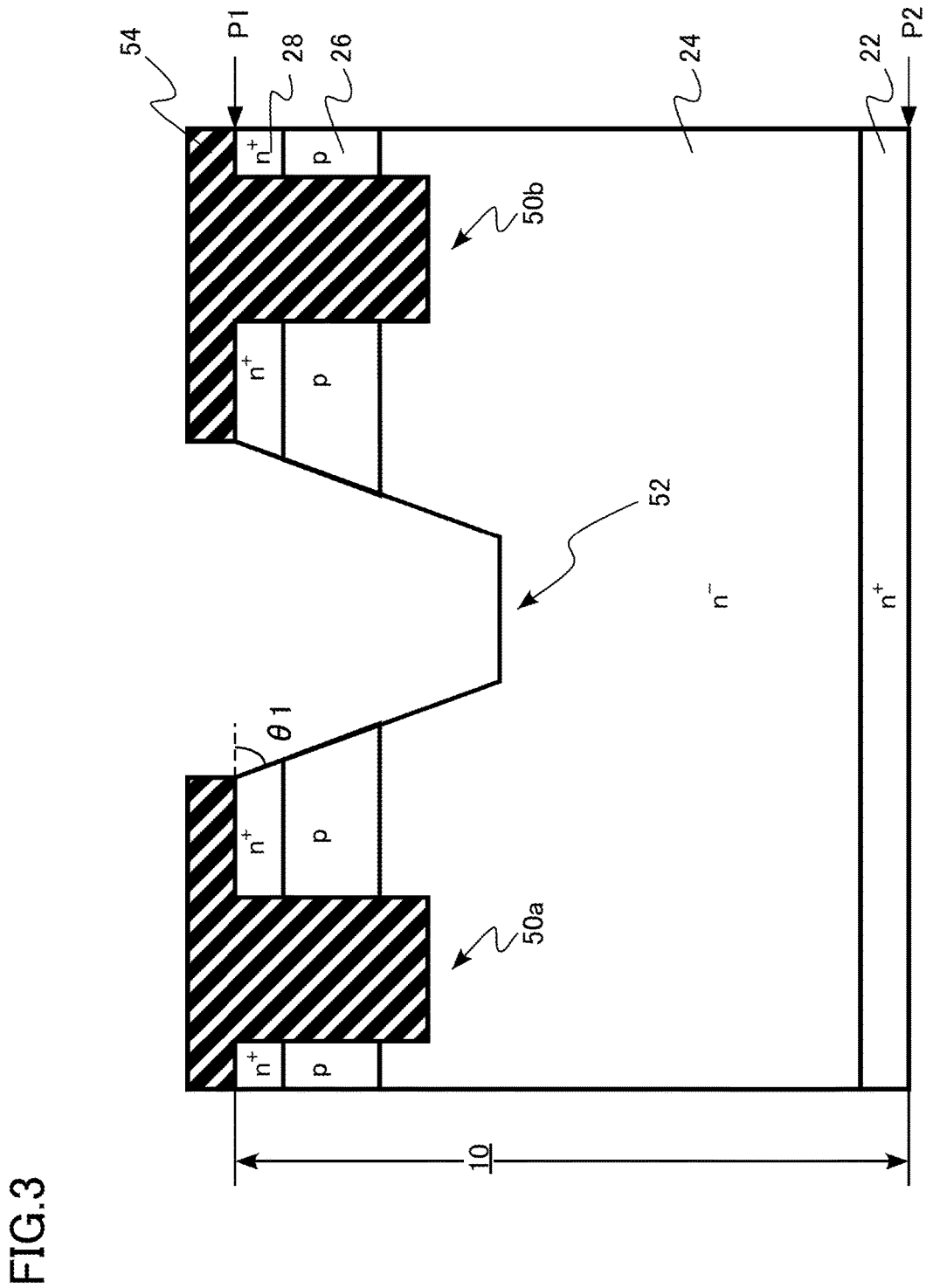
FIG. 3 is a cross-sectional view schematically illustrating the semiconductor device that is being manufactured in the semiconductor device manufacturing method according to the first embodiment.

Then, the contact trench (second trench) 52 is formed in the first plane, using the mask member 54 as a mask (FIG. 3). The contact trench 52 is formed between the first gate trench 50a and the second gate trench 50b. The depth of the contact trench 52 is greater than the depth of the p well region 26. The contact trench 52 is formed such that the first inclination angle ("θ1" in FIG. 3) of the side surface of the contact trench 52 with respect to the first plane is equal to or greater than 60 degrees and equal to or less than 85 degrees.

The contact trench 52 is formed by, for example, anisotropic dry etching. The etching conditions of the anisotropic dry etching can be controlled to adjust the inclination angle of the side surface of the contact trench 52 to a desired angle.

The depth of the contact trench 52 is greater than, for example, the depth of the first gate trench 50a and the second gate trench 50b.

Figure 4:
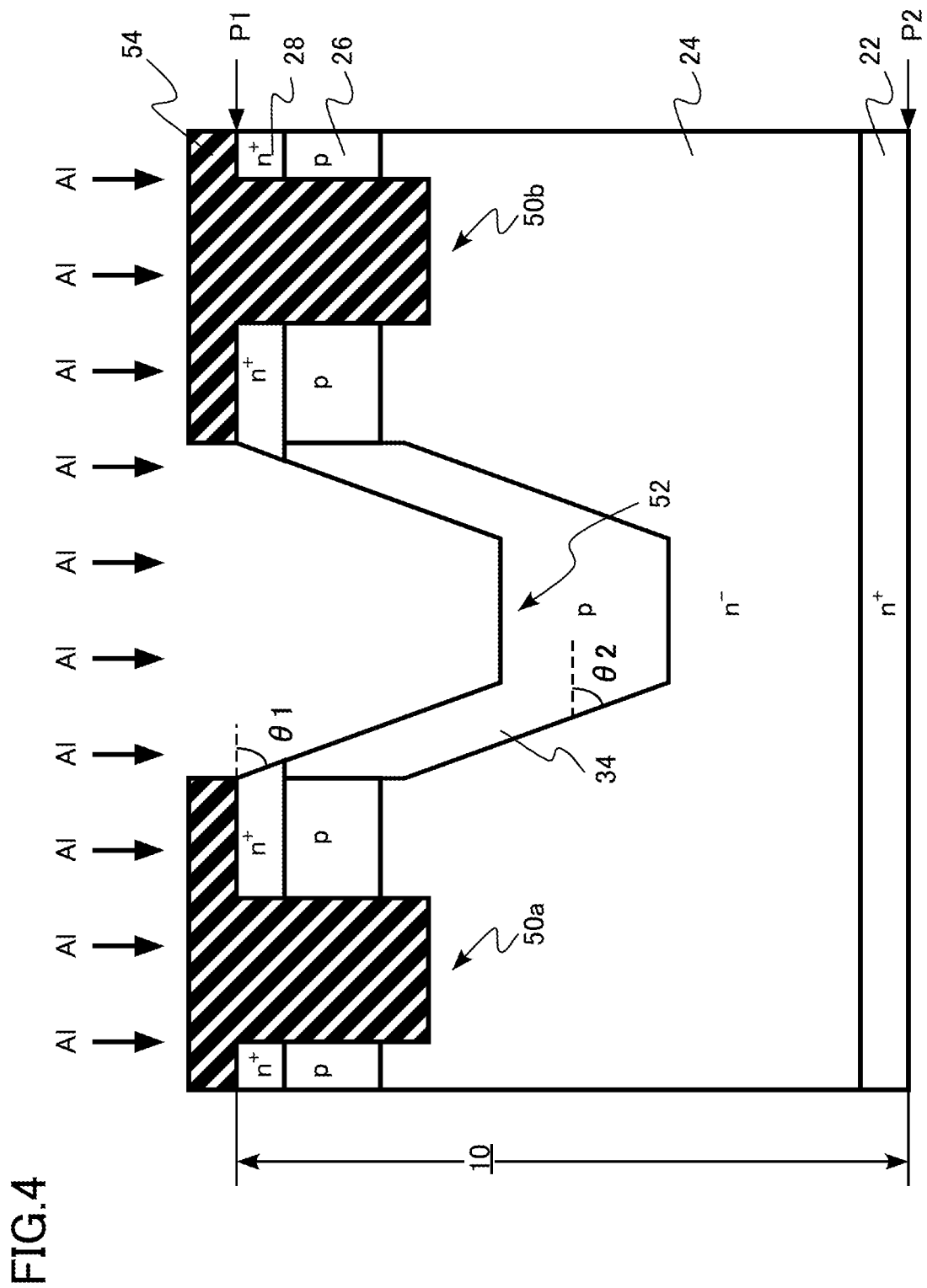
FIG. 4 is a cross-sectional view schematically illustrating the semiconductor device that is being manufactured in the semiconductor device manufacturing method according to the first embodiment.

Then, aluminum (Al) ions which are p-type impurity ions are implanted from the side and bottom of the contact trench 52 into the SiC layer 10, using the mask member 54 as a mask (FIG. 4). The p-type electric field reducing region (third region) 34 is formed by the ion implantation.

The ion implantation is performed under the condition that an inclination angle with respect to the line normal to the first plane is equal to or less than 1 degree. Hereinafter, the ion implantation performed under the condition that the inclination angle with respect to the line normal to the first plane is equal to or less than 1 degree is referred to as vertical ion implantation. For example, the ion implantation is performed under the condition that the p-type impurity concentration of the electric field reducing region 34 is higher than that of the p well region 26.

The boundary between the electric field reducing region 34 and the drift region 24 is substantially parallel to the side surface of the contact trench 52. The second inclination angle ("θ2" in FIG. 4) of the boundary between the electric field reducing region 34 and the drift region 24 with respect to the plane parallel to the first plane is substantially equal to the first inclination angle ("θ1" in FIG. 4) of the side surface of the contact trench 52 with respect to the first plane and is, for example, equal to or greater than 60 degrees and equal to or less than 85 degrees.

Figure 5:
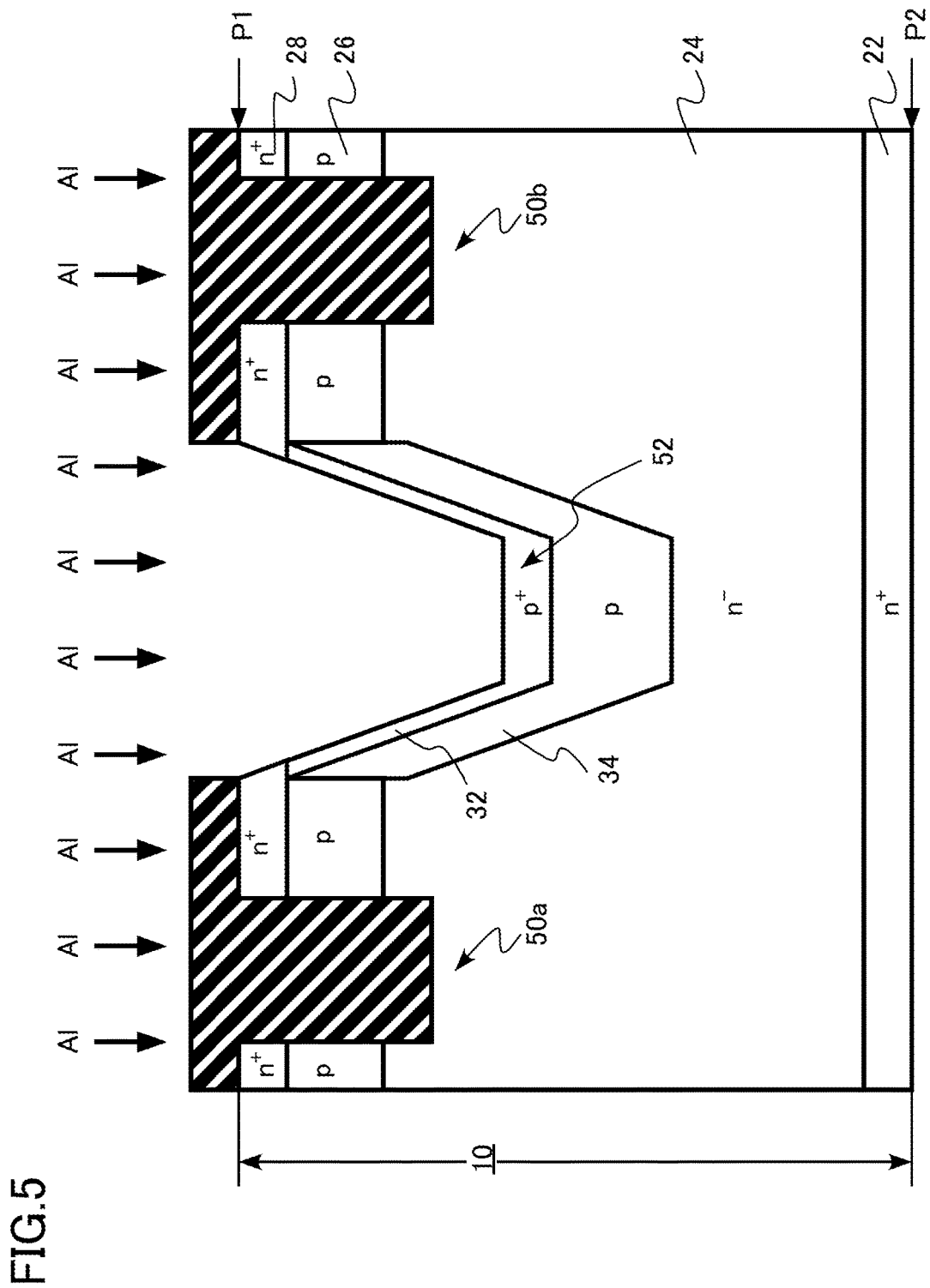
FIG. 5 is a cross-sectional view schematically illustrating the semiconductor device that is being manufactured in the semiconductor device manufacturing method according to the first embodiment.

Then, aluminum (Al) ions which are p-type impurity ions are implanted from the side and bottom of the contact trench 52 into the SiC layer 10, using the mask member 54 as a mask (FIG. 5). The p-type contact region (fourth region) 32 is formed by the ion implantation.

The ion implantation is performed under the condition that an inclination angle with respect to the line normal to the first plane is equal to or less than 1 degree. For example, the ion implantation is performed under the condition that the p-type impurity concentration of the p-type contact region 32 is higher than that of the electric field reducing region 34.

Then, a heat treatment for activating the p-type impurities and the n-type impurities introduced into the SiC layer 10 by the ion implantation is performed. The heat treatment is performed in, for example, a non-oxidizing atmosphere.

The p well region 26 becomes the first p well region 26a and the second p well region 26b. The source region 28 becomes the first source region 28a and the second source region 28b.

Figure 6:
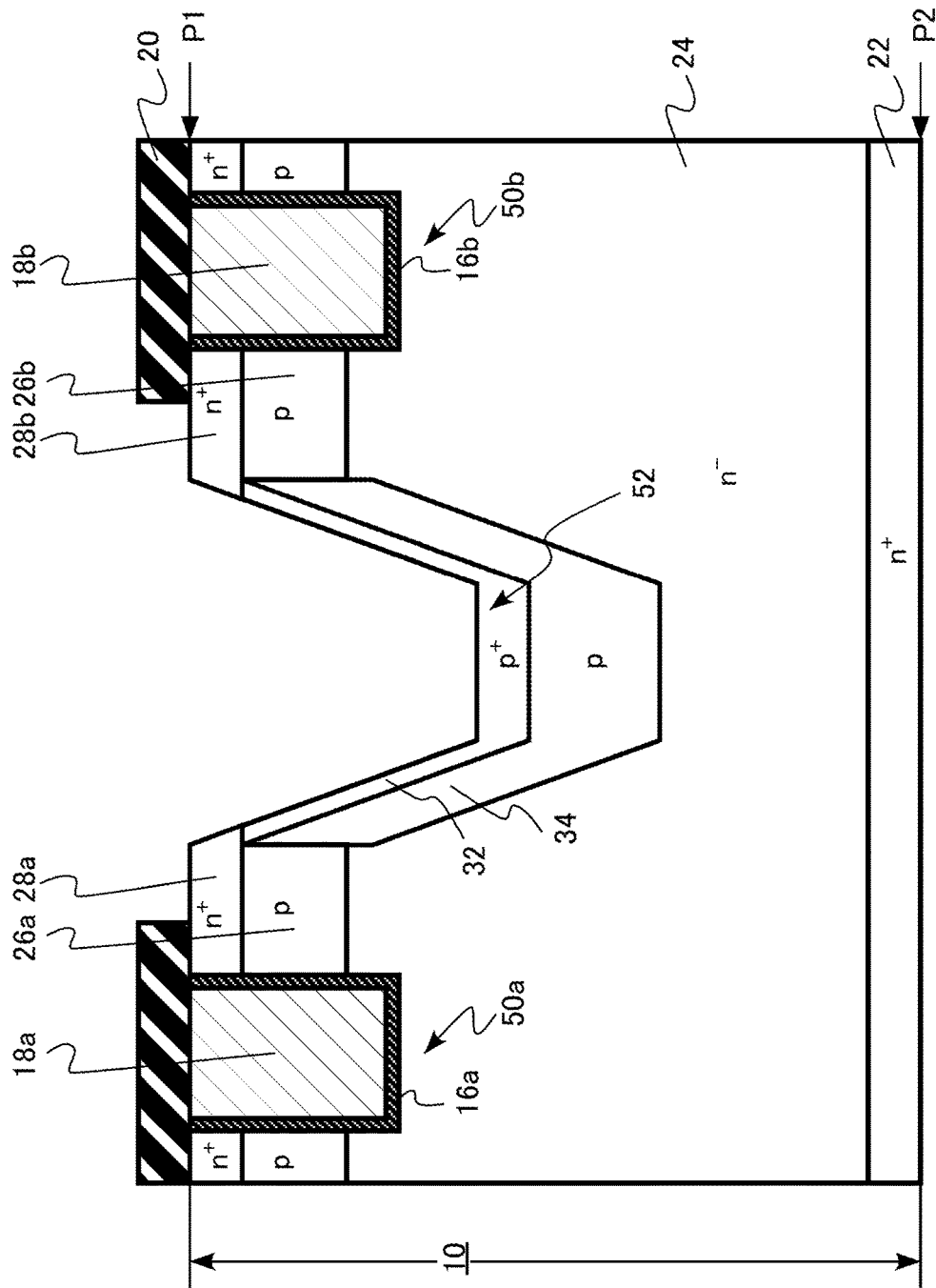
FIG. 6 is a cross-sectional view schematically illustrating the semiconductor device that is being manufactured in the semiconductor device manufacturing method according to the first embodiment.

Then, the mask member 54 is removed. Then, the gate insulating layer 16, the gate electrode 18, and the interlayer insulating film 20 are formed by a known process technique (FIG. 6).

Then, the source electrode 12 is formed on the front surface of the SiC layer 10 by a known process technique. The source electrode 12 is formed so as to fill the contact trench 52. In addition, the drain electrode 14 is formed on the rear surface of the SiC layer 10.

The MOSFET 100 illustrated in FIG. 1 is formed by the above-mentioned manufacturing method.

Next, the function and effect of the semiconductor device according to this embodiment will be described.

In the MOSFET 100 according to this embodiment, the electric field reducing region 34 is provided around the contact trench 52 with an inclined side surface such that a pn junction is inclined. According to this structure, it is possible to improve the breakdown voltage of the gate insulating layer and to reduce on-resistance.

The contact region 32 with a high p-type impurity concentration is provided around the contact trench 52. According to this structure, it is possible to improve the secondary breakdown resistance of the MOSFET 100.

The trench gate MOSFET has the problem that, when the MOSFET is turned off, the electric field is concentrated on the bottom of the trench and the breakdown voltage of the gate insulating layer is reduced. In particular, the electric field is concentrated on the corners of the trench and the breakdown voltage of the gate insulating layer is reduced, which results in a reduction in the breakdown voltage of the MOSFET.

Figure 7:
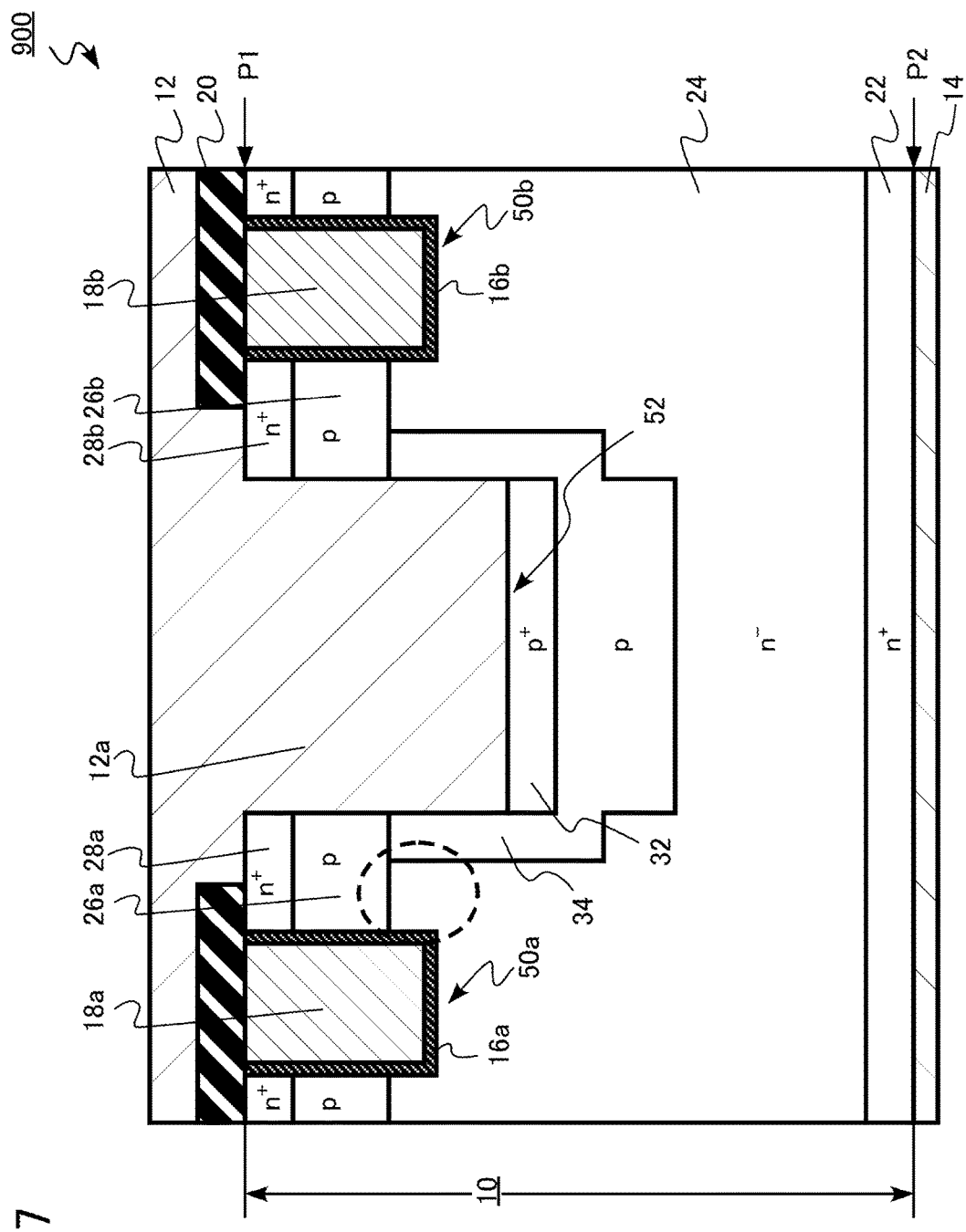
FIG. 7 is a cross-sectional view schematically illustrating a semiconductor device according to a comparative example.

FIG. 7 is a cross-sectional view schematically illustrating a semiconductor device according to a comparative example. A MOSFET 900 according to the comparative example differs from the MOSFET 100 according to this embodiment in that the side surface of a contact trench 52 is perpendicular to the first plane. In addition, the MOSFET 900 according to the comparative example differs from the MOSFET 100 according to this embodiment in that the side surface of the contact trench 52 does not have the contact region 32.

The MOSFET 900 according to the comparative example includes an electric field reducing region 34 that is deeper than the first p well region 26a and the second p well region 26b, similarly to the MOSFET 100 according to this embodiment. When a reverse bias is applied, the electric field is also concentrated on the electric field reducing region 34 and the concentration of the electric field on the corners of the trench is reduced. Therefore, the maximum electric field strength of the first gate insulating layer 16a and the second gate insulating layer 16b is reduced. As a result, the breakdown voltage of the first gate insulating layer 16a and the second gate insulating layer 16b is improved.

However, in the MOSFET 900, the side surface of the contact trench 52 is perpendicular to the first plane. Therefore, the width of a portion of the drift region 24 which is interposed between the first gate insulating layer 16a and the electric field reducing region 34 is reduced. A portion of the drift region 24 which is interposed between the first gate insulating layer 16a and the electric field reducing region 34 is a region surrounded by a dashed line in FIG. 7. Therefore, a current path from a channel region to the drain electrode 14 is narrowed, which results in an increase in the on-resistance of the MOSFET 900.

Figure 8:
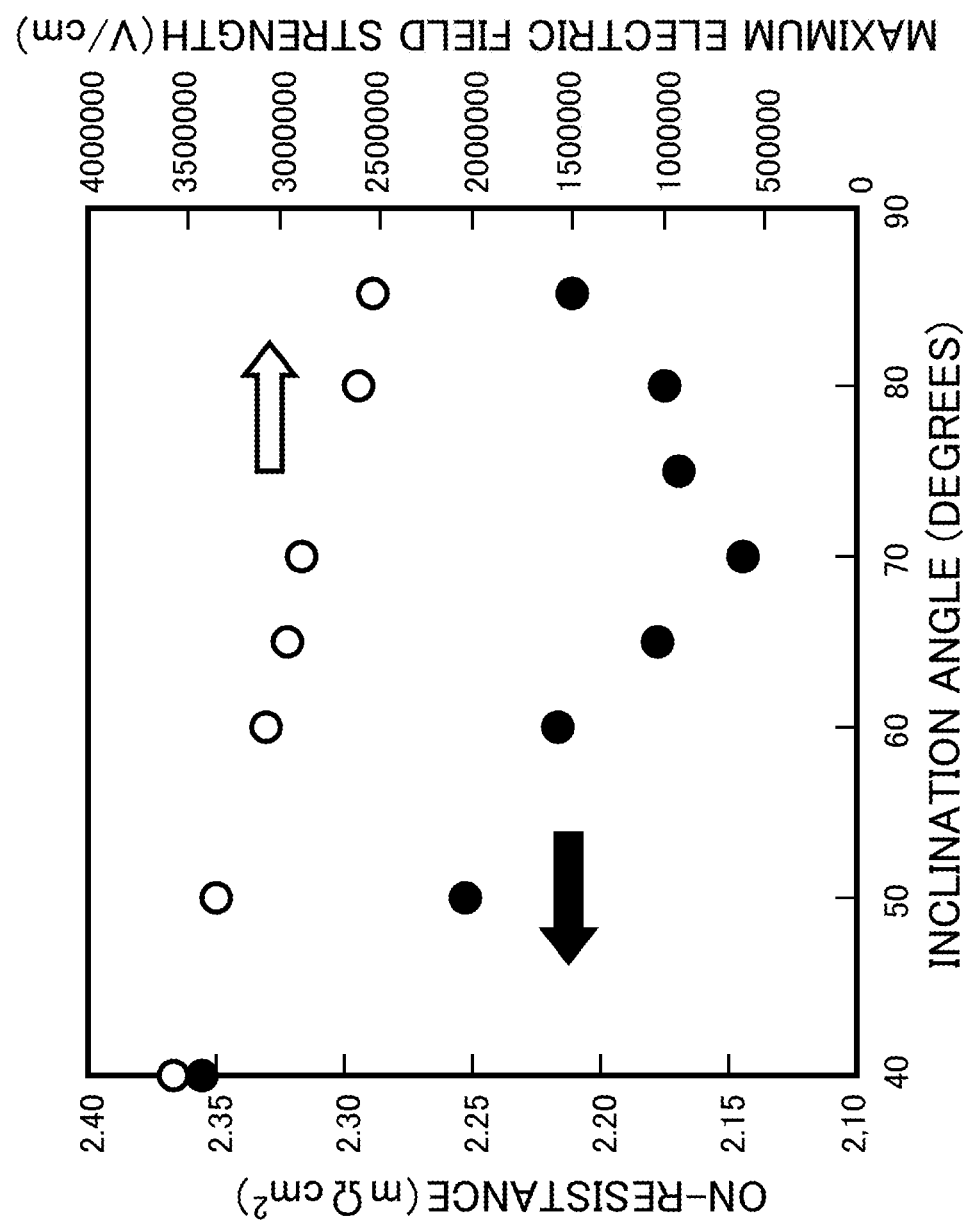
FIG. 8 is a diagram illustrating the function and effect of the semiconductor device according to the first embodiment.

FIG. 8 is a diagram illustrating the function and effect of this embodiment. FIG. 8 illustrates the relationship along the first inclination angle ("θ1" in FIG. 1) of the side surface of the contact trench 52, the on-resistance (a black circle in FIG. 8) of the MOSFET 100, and the maximum electric field strength applied to the gate insulating layer (a white circle in FIG. 8).

FIG. 8 illustrates the simulation results. In the simulation, the first inclination angle ("θ1" in FIG. 1) of the side surface of the contact trench 52 is a variable and the width ("W2" in FIG. 1) of the contact trench 52 changes following a change in the first inclination angle.

The second inclination angle ("θ2" in FIG. 1) of the boundary between the electric field reducing region 34 and the drift region 24 with respect to the plane parallel to the first plane is the same as the first inclination angle ("θ1" in FIG. 1) of the side surface of the contact trench 52 with respect to the first plane.

As can be seen from FIG. 8, as the inclination angle increases, the maximum electric field strength decreases. The reason is that, since the electric field reducing region 34 is close to the first gate trench 50a and the second gate trench 50b, the effect of reducing the electric field of the gate insulating layer is large.

In contrast, for on-resistance, in an inclination angle range of greater than 70 degrees, the on-resistance increases as the inclination angle increases. The reason is that, since the electric field reducing region 34 is close to the first gate trench 50a and the second gate trench 50b, a current path is narrowed.

Furthermore, in an inclination angle range of less than 70 degrees, the on-resistance increases as the inclination angle decreases. The reason is that, as the width of the contact trench 52 increases, a cell pitch increases.

It is preferable that the first inclination angle of the side surface of the contact trench 52 be equal to or greater than 60 degrees and equal to or less than 85 degrees, in order to improve the breakdown voltage of the gate insulating layer and to reduce on-resistance. In addition, the first inclination angle is more preferably equal to or greater than 65 degrees and equal to or less than 80 and most preferably equal to or greater than 70 degrees and equal to or less than 75 degrees.

From the same point of view as described above, the second inclination angle of the boundary between the electric field reducing region 34 and the drift region 24 is preferably equal to or greater than 60 degrees and equal to or less than 85 degrees. The second inclination angle is more preferably equal to or greater than 65 degrees and equal to or less than 80 degrees and most preferably equal to or greater than 70 degrees and equal to or less than 75 degrees.

It is preferable that the depth of the electric field reducing region 34 be greater than the depth of the first gate trench 50a and the second gate trench 50b in order to increase the effect of reducing the electric field of the gate insulating layer.

In the MOSFET 100 according to this embodiment, the distance ("S" in FIG. 1) between the trench source region 12a and the first gate insulating layer 16a is preferably equal to or greater than 0.1 μm and equal to or less than 0.8 μm and more preferably equal to or greater than 0.3 μm and equal to or less than 0.6 μm. Similarly, the distance between the trench source region 12a and the second gate insulating layer 16b is preferably equal to or greater than 0.1 μm and equal to or less than 0.8 μm and more preferably equal to or greater than 0.3 μm and equal to or less than 0.6 μm. When the distance is less than the above-mentioned range, there is a concern that a current path will be narrowed and the on-resistance of the MOSFET 100 will increase. In addition, when the distance is greater than the range, there is a concern that a cell pitch will increase and the on-resistance of the MOSFET 100 will increase.

In the MOSFET 100 according to this embodiment, the contact region 32 with a high p-type impurity concentration is provided around the contact trench 52. The contact area of the contact region 32 with the source electrode 12 is greater than that in the MOSFET 900 according to the comparative example. Therefore, the electric resistance between the source electrode 12 and the electric field reducing region 34 is lower than that in the MOSFET 900.

In a case in which avalanche breakdown occurs when a reverse bias is applied to the MOSFET 100, holes are transiently accumulated in the electric field reducing region 34. The avalanche breakdown is also referred to as primary breakdown.

When the electric resistance between the source electrode 12 and the electric field reducing region 34 is high, the potential of the electric field reducing region 34 is reduced by the accumulated holes. Then, a parasitic bipolar transistor formed by the source region, the electric field reducing region, the drift region is turned on and there is a concern that secondary breakdown will occur. When the secondary breakdown is large, a large amount of current flows. As a result, there is a concern that the MOSFET 100 will be broken.

In the MOSFET 100 according to this embodiment, since the electric resistance between the source electrode 12 and the electric field reducing region 34 is low, the accumulated holes are likely to move to the source electrode 12. Therefore, a reduction in the potential of the electric field reducing region 34 is prevented and the secondary breakdown is less likely to occur. As a result, secondary breakdown resistance is improved.

It is preferable that the p-type impurity concentration of the electric field reducing region 34 be higher than the p-type impurity concentration of the first p well region 26a and the second p well region 26b. When the p-type impurity concentration of the electric field reducing region 34 is high, an increase in the width of a depletion layer which extends to the electric field reducing region 34 when a reverse bias is applied is prevented and the depletion layer is prevented from reaching the contact region 32. The contact region 32 with a high impurity concentration has a high density of crystal defects. When the depletion layer reaches the contact region 32, there is a concern that the amount of leakage current flowing between the source electrode 12 and the drain electrode 14 will increase.

In addition, when the p-type impurity concentration of the electric field reducing region 34 is high, the width of the depletion layer in the drift region 24 increases during the application of a reverse bias and the effect of reducing the electric field of the gate insulating layer increases.

It is preferable that the p-type impurity concentration of the electric field reducing region 34 be equal to or greater than two times the p-type impurity concentration of the first p well region 26a and the second p well region 26b, in order to reduce the amount of leakage current when a reverse bias is applied and to reduce the maximum electric field strength of the gate insulating layer.

It is preferable that the top of the contact region 32 come into contact with the first source region 28a and the second source region 28b, in order to increase the contact area of the contact region 32 with the source electrode 12.

In the semiconductor device manufacturing method according to this embodiment, the electric field reducing region 34 and the contact region 32 are not formed by oblique ion implantation, but is formed by vertical ion implantation. Therefore, the number of ion implantation processes is reduced and it is easy to manufacture the MOSFET 100. In addition, a variation in the manufacture of the MOSFET 100 is reduced.

FIGS. 9 to 13 are cross-sectional views schematically illustrating the semiconductor device which is being manufactured in the semiconductor device manufacturing method according to the comparative example. FIGS. 9 to 13 illustrate a method for manufacturing the MOSFET 900 illustrated in FIG. 7. The description of the same content as that in the manufacturing method according to this embodiment will not be repeated.

Steps up to the formation of the mask member 54 are the same as those in the manufacturing method according to this embodiment.

Figure 9:
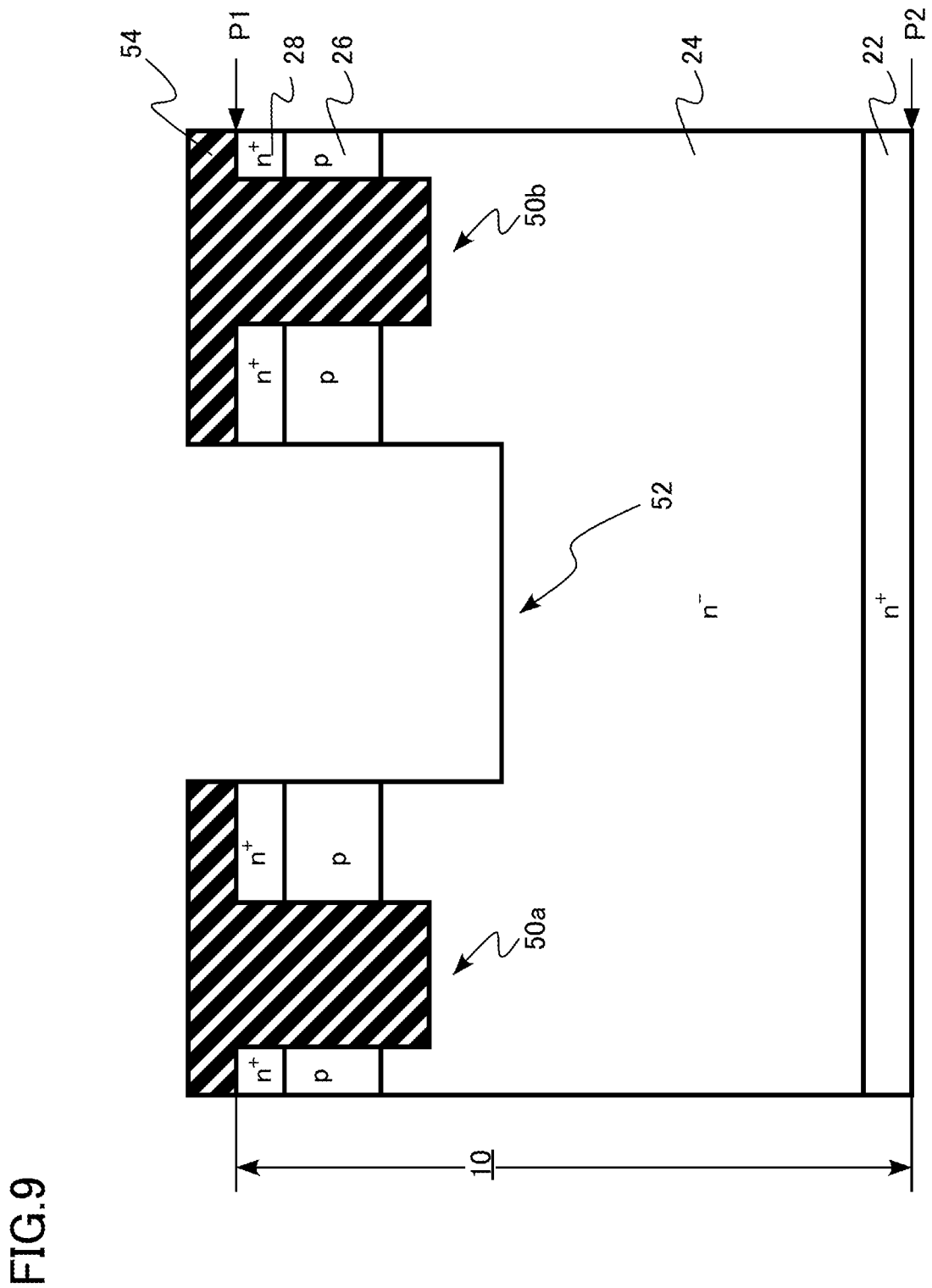
FIG. 9 is a cross-sectional view schematically illustrating the semiconductor device which is being manufactured in a semiconductor device manufacturing method according to the comparative example.

Then, the contact trench 52 is formed in the first plane, using the mask member 54 as a mask (FIG. 9). The contact trench 52 is formed between the first gate trench 50a and the second gate trench 50b.

The inclination angle of the side surface of the contact trench 52 with respect to the first plane is 90 degrees. In other words, the side surface of the contact trench 52 is perpendicular to the first plane.

The contact trench 52 is formed by, for example, anisotropic dry etching (FIG. 9).

Figure 10:
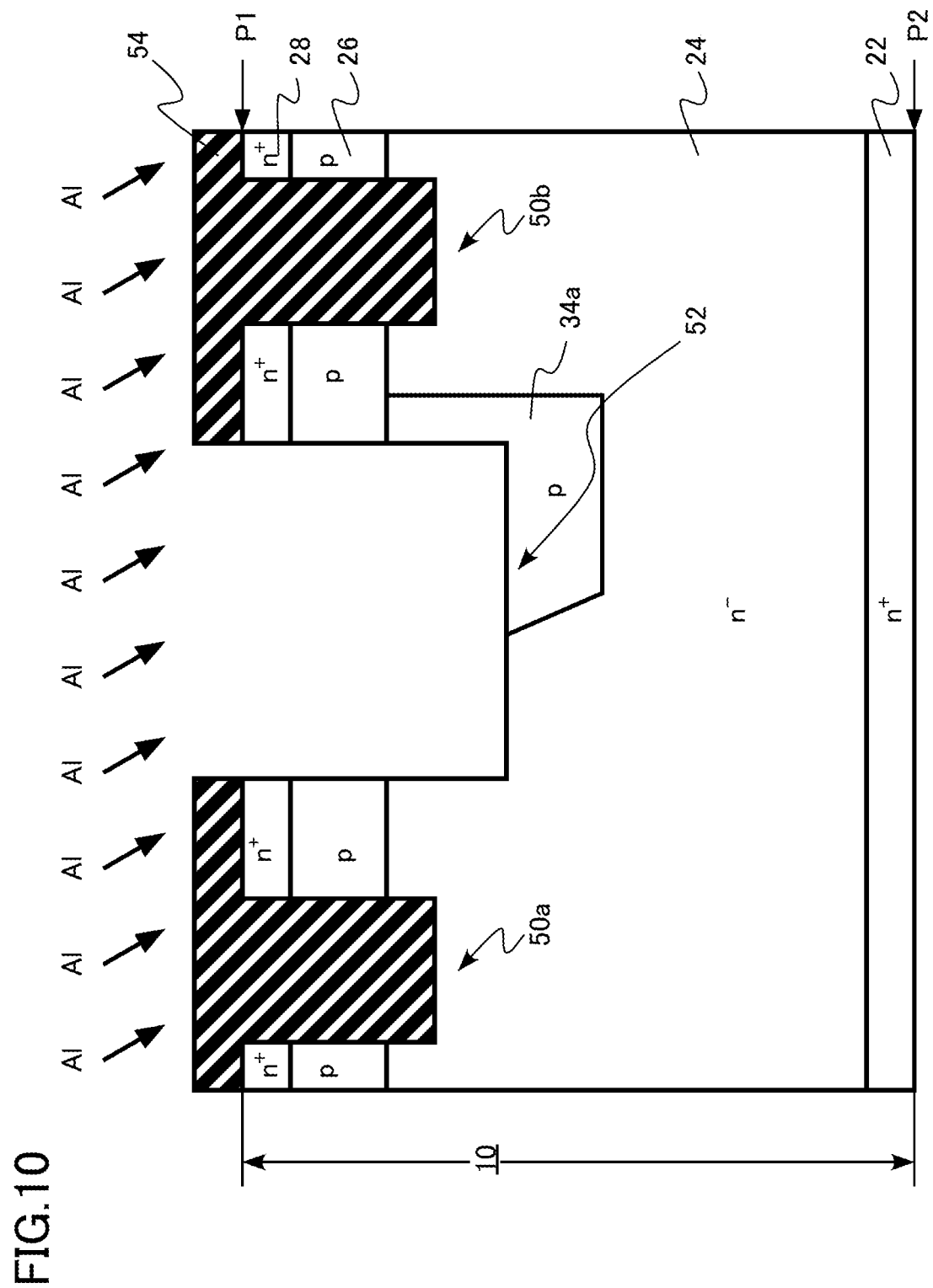
FIG. 10 is a cross-sectional view schematically illustrating the semiconductor device which is being manufactured in the semiconductor device manufacturing method according to the comparative example.

Then, aluminum (Al) ions which are p-type impurity ions are implanted from one side surface of the contact trench 52 into the SiC layer 10, using the mask member 54 as a mask (FIG. 10). A portion 34a of the p-type electric field reducing region (third region) 34 is formed by the ion implantation.

The ion implantation is oblique ion implantation in which an ion implantation direction is inclined with respect to the line normal to the first plane. The inclination angle of the implantation direction with respect to the line normal to the first plane is, for example, equal to or greater than 15 degrees and equal to or less than 45 degrees.

Figure 11:
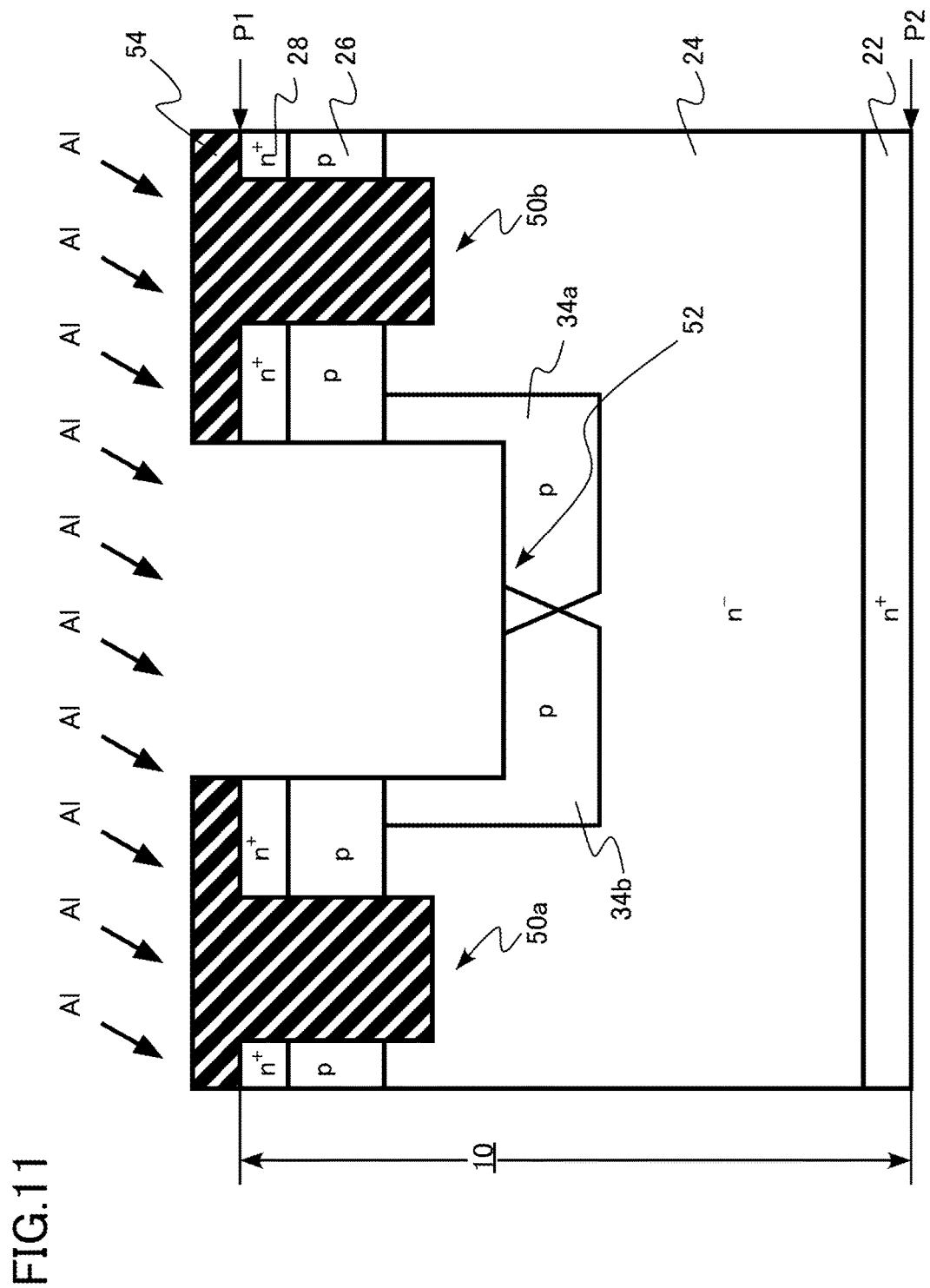
FIG. 11 is a cross-sectional view schematically illustrating the semiconductor device which is being manufactured in the semiconductor device manufacturing method according to the comparative example.

Then, aluminum (Al) ions which are p-type impurity ions are implanted from the other side surface of the contact trench 52 into the SiC layer 10, using the mask member 54 as a mask (FIG. 11). A portion 34b of the p-type electric field reducing region (third region) 34 is formed by the ion implantation.

The ion implantation is oblique ion implantation in which an ion implantation direction is inclined with respect to the line normal to the first plane. The inclination angle of the implantation direction with respect to the line normal to the first plane is, for example, equal to or greater than 15 degrees and equal to or less than 45 degrees.

Figure 12:
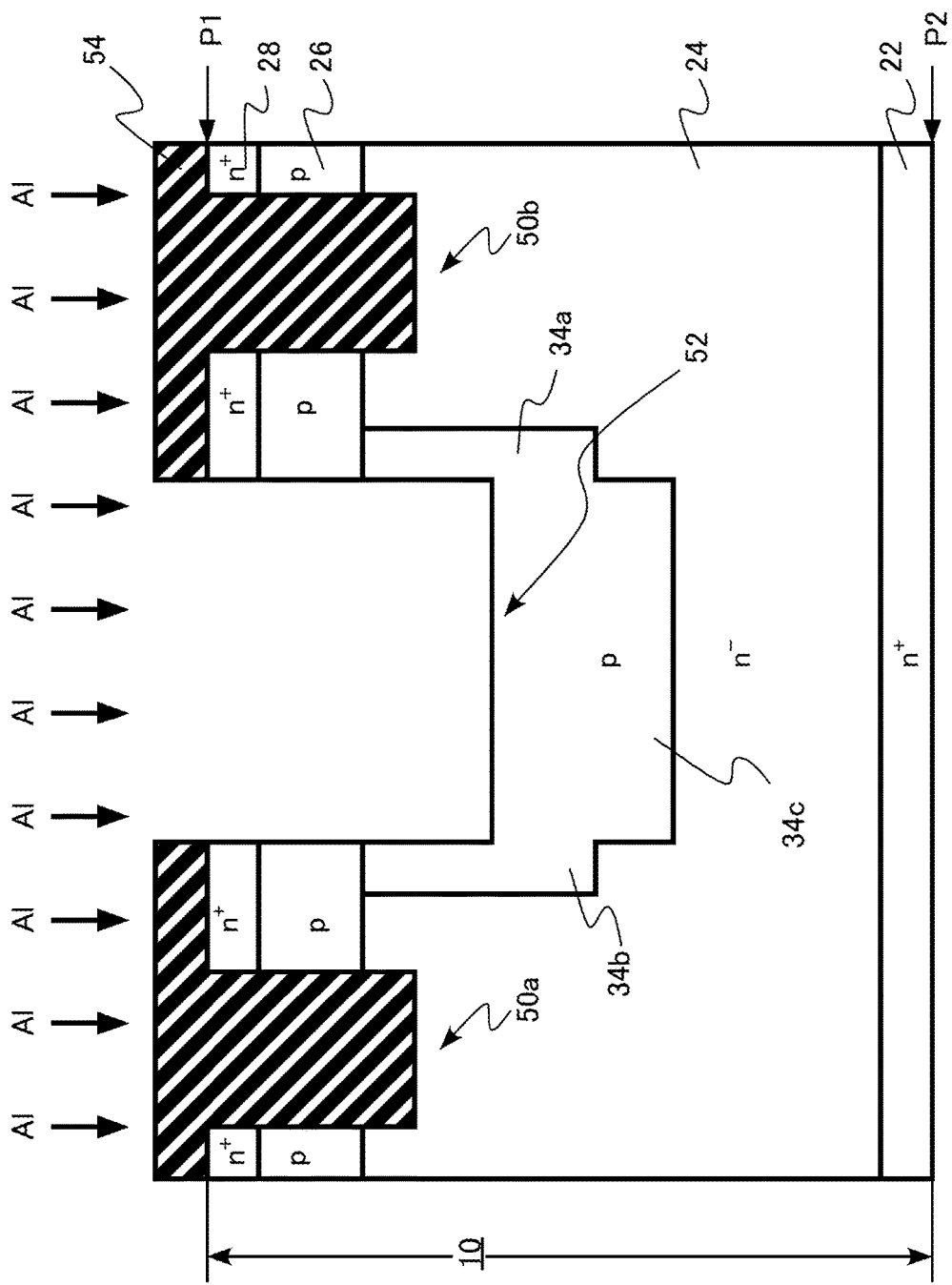
FIG. 12 is a cross-sectional view schematically illustrating the semiconductor device which is being manufactured in the semiconductor device manufacturing method according to the comparative example.

Then, aluminum (Al) ions which are p-type impurity ions are implanted from the bottom of the contact trench 52 into the SiC layer 10, using the mask member 54 as a mask (FIG. 12). A portion 34c of the p-type electric field reducing region (third region) 34 is formed by the ion implantation. The ion implantation is vertical ion implantation.

Figure 13:
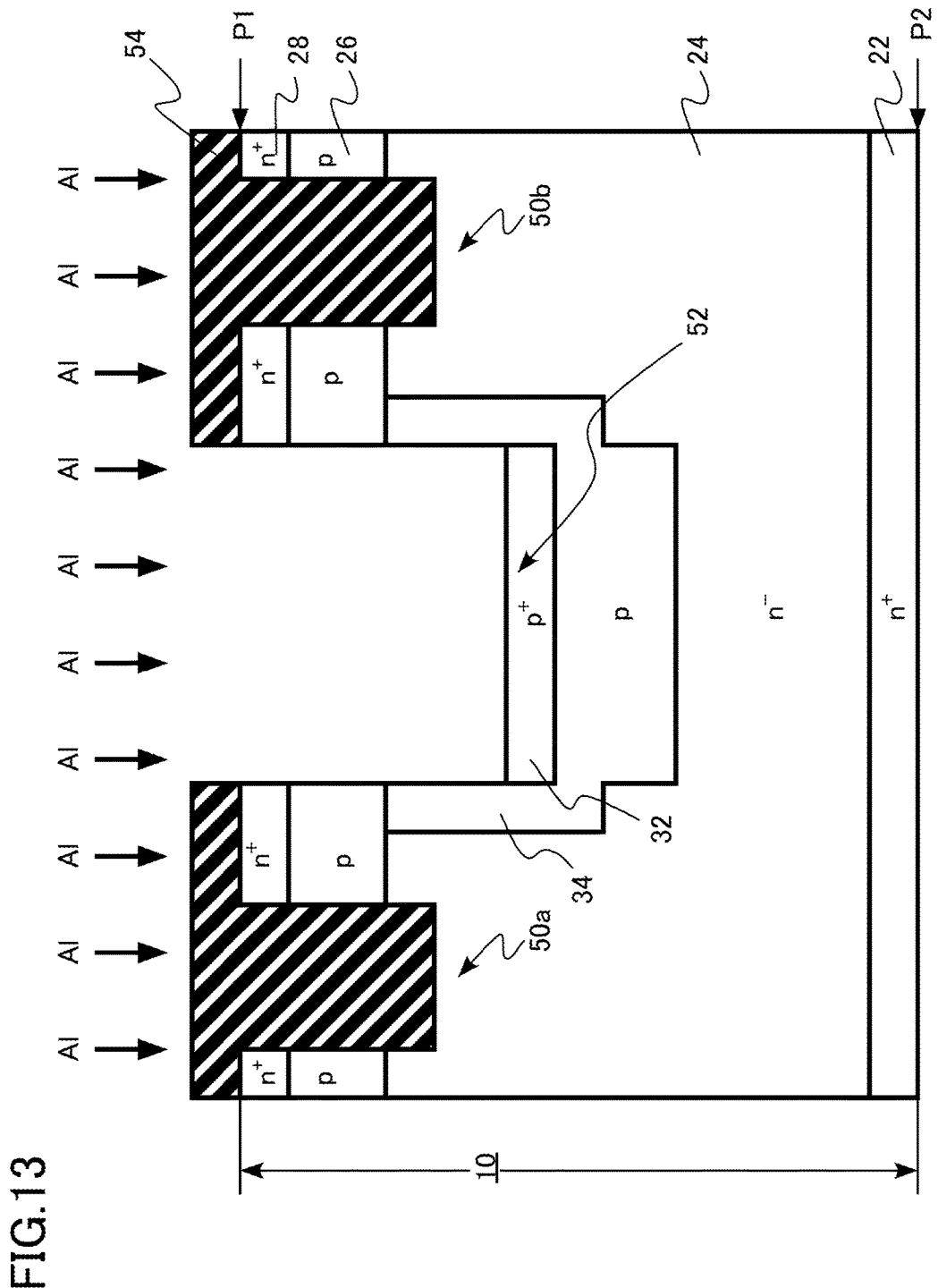
FIG. 13 is a cross-sectional view schematically illustrating the semiconductor device which is being manufactured in the semiconductor device manufacturing method according to the comparative example.

Then, aluminum (Al) ions which are p-type impurity ions are implanted from the bottom of the contact trench 52 into the SiC layer 10, using the mask member 54 as a mask (FIG. 13). The p-type contact region (fourth region) 32 is formed by the ion implantation. The ion implantation is vertical ion implantation.

The subsequent steps in the manufacturing method are the same as those in the manufacturing method according to this embodiment.

As described above, in the method for manufacturing the MOSFET 900 according to the comparative example, the oblique ion implantation needs to be performed at least two times in order to form the electric field reducing region 34. Therefore, the number of ion implantation processes is greater than that in the method for manufacturing the MOSFET 100 according to this embodiment. As a result, MOSFET manufacturing costs increase.

According to the method for manufacturing the MOSFET 100 according to this embodiment, the number of ion implantation processes is reduced and manufacturing costs are reduced.

In the method for manufacturing the MOSFET 900, the electric field reducing region 34 on the side surface of the contact trench 52 is formed by oblique ion implantation. Therefore, the width of a portion of the drift region 24 which is interposed between the first gate insulating layer 16a and the electric field reducing region 34 varies with a variation in the range of ion implantation. Therefore, there is a concern that a variation in on-resistance will increase.

In addition, since the electric field reducing region 34 is formed by a plurality of ion implantation processes, a variation in, for example, the shape and p-type impurity concentration of the electric field reducing region 34 increases.

According to the method for manufacturing the MOSFET 100 of this embodiment, the electric field reducing region 34 is formed by vertical ion implantation. Therefore, the width of a portion of the drift region 24 which is interposed between the first gate insulating layer 16a and the electric field reducing region 34 does not depend on a variation in the range of ion implantation. As a result, a variation in on-resistance is reduced.

According to the method for manufacturing the MOSFET 100 of this embodiment, since the electric field reducing region 34 is formed by one ion implantation process, a variation in, for example, the shape and p-type impurity concentration of the electric field reducing region 34 is reduced.

Figure 14:
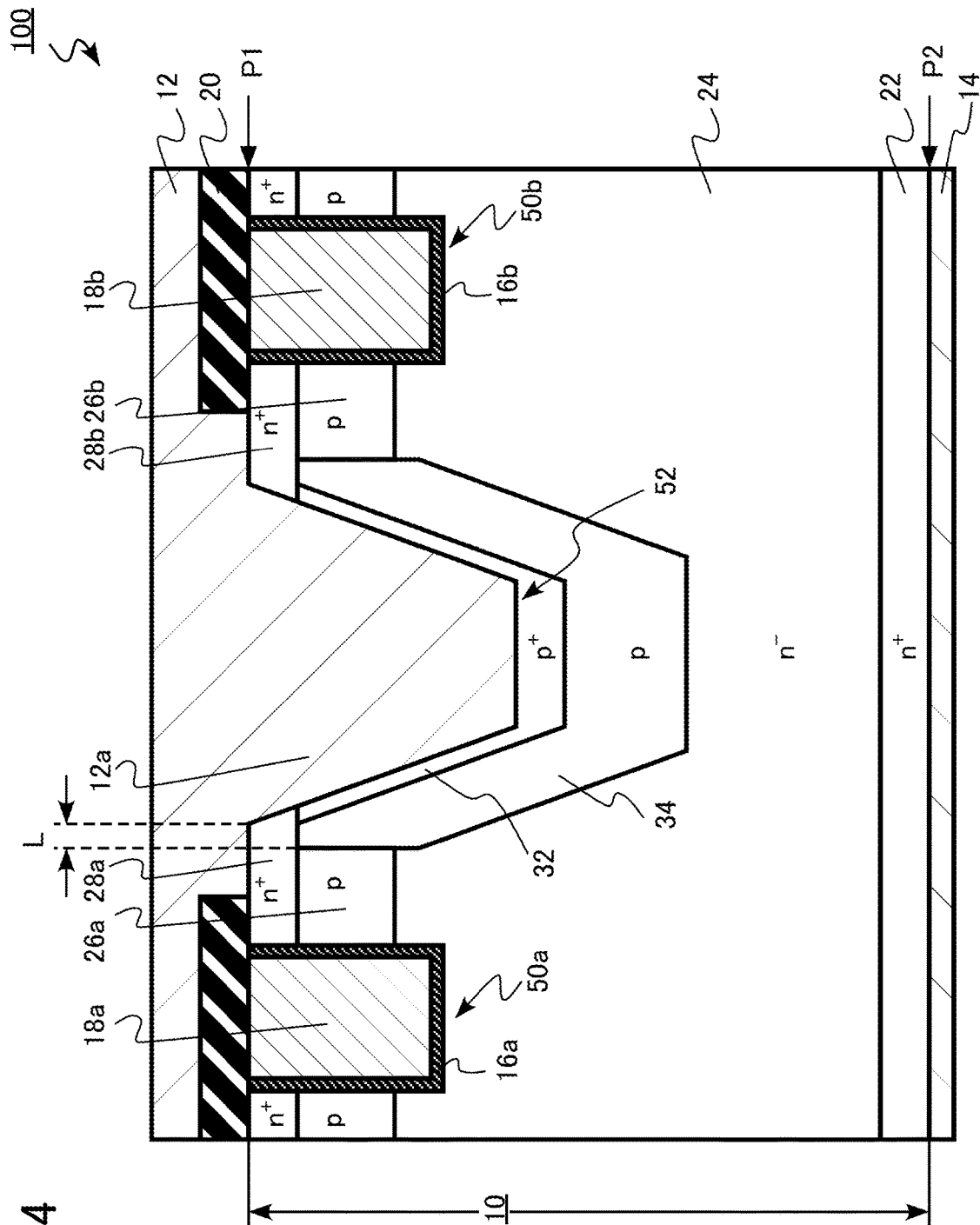
FIG. 14 is a diagram illustrating the function and effect of the semiconductor device according to the first embodiment.
Figure 15:
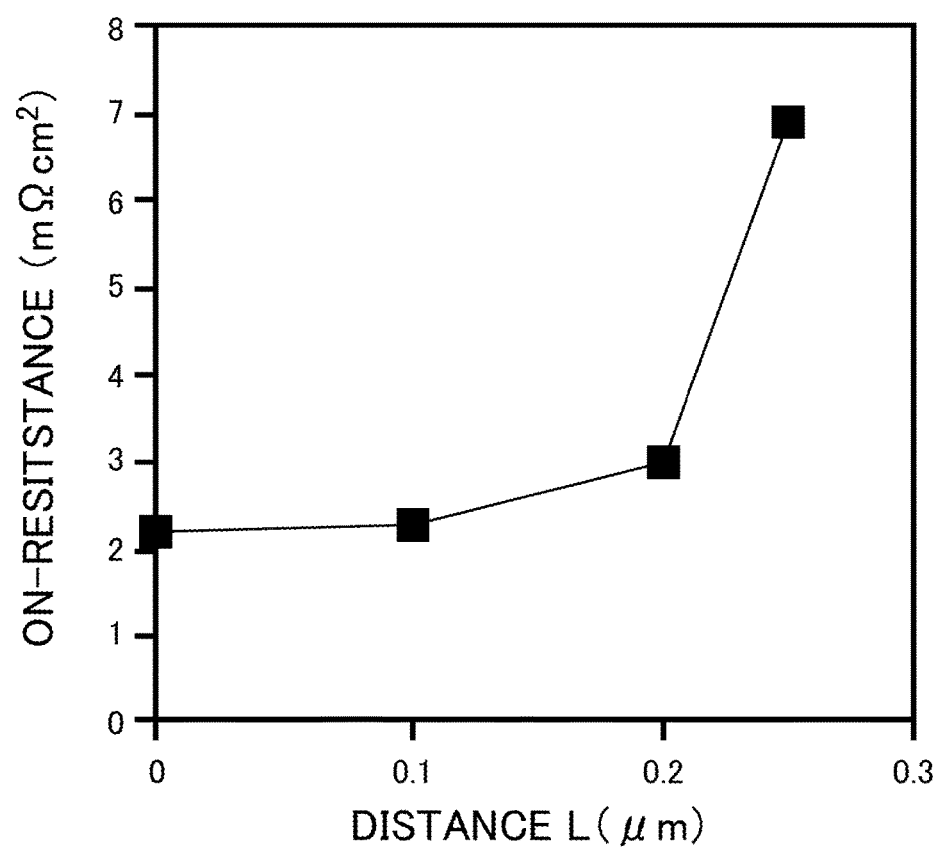
FIG. 15 is a diagram illustrating the function and effect of the semiconductor device according to the first embodiment.

FIGS. 14 and 15 are diagrams illustrating the function and effect of this embodiment. FIGS. 14 and 15 illustrate the simulation results of the distance between the trench source region 12a and the electric field reducing region 34 and on-resistance.

FIG. 14 is a diagram illustrating simulation parameters. A simulation is performed while the distance ("L" in FIG. 15) between the trench source region 12a and the electric field reducing region 34 is changed. In other words, the distance between the trench source region 12a and the electric field reducing region 34 is the difference between the distance between the trench source region (first region) 12a and the first gate insulating layer 16a and the distance between the electric field reducing region (seventh silicon carbide region) and the first gate insulating layer 16a. In other words, the distance between the trench source region 12a and the electric field reducing region 34 is the distance between the end of an opening portion of the contact trench 52 in the first plane and a first-gate-trench-side end portion of the electric field reducing region 34.

As can be seen from FIG. 15, when the distance between the trench source region 12a and the electric field reducing region 34 is greater than 0.2 µm, on-resistance increases rapidly. Therefore, it is preferable that the distance between the trench source region 12a and the electric field reducing region 34 be equal to or less than 0.1 µm.

According to the method for manufacturing the MOSFET 100 of this embodiment, the electric field reducing region 34 is not formed by oblique ion implantation, but is formed by vertical ion implantation. Therefore, the distance between the trench source region 12a and the electric field reducing region 34 can be zero in principle.

It is preferable that the distance between a second-plane-side end portion of the electric field reducing region 34 and the bottom of the contact trench 52 be equal to or less than 1 µm, in order to form the electric field reducing region 34, without using high-energy ion implantation with a high process cost.

It is preferable that the depth of the contact trench 52 be greater than the depth of the first gate trench 50a and the second gate trench 50b, in order to form the electric field reducing region 34, without using high-energy ion implantation with a high process cost.

Figure 16:
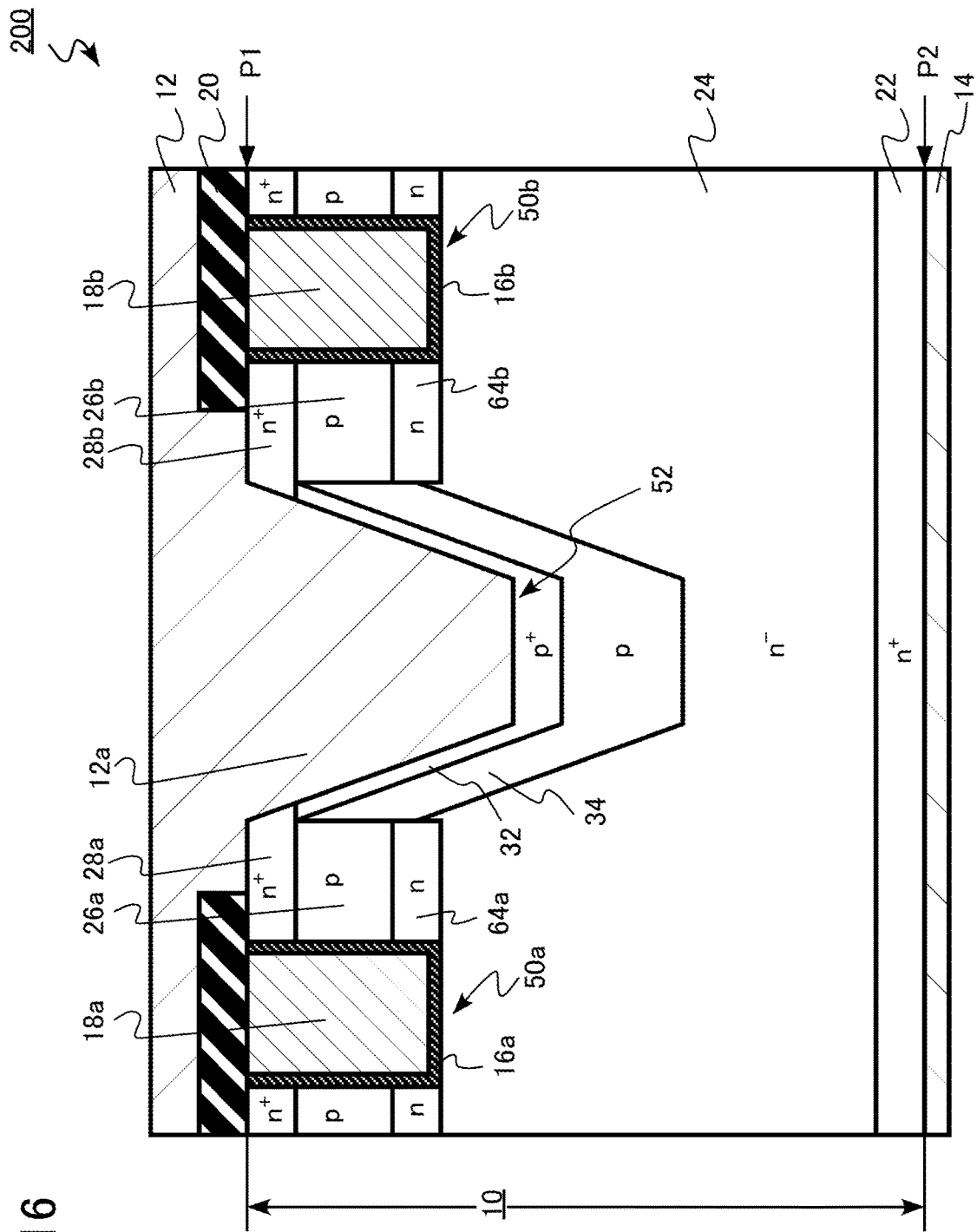
FIG. 16 is a cross-sectional view schematically illustrating a modification example of the semiconductor device according to the first embodiment.

FIG. 16 is a cross-sectional view schematically illustrating a modification example of the semiconductor device according to this embodiment. A MOSFET 200 according to the modification example differs from the MOSFET 100 only in that it includes a first high-concentration drift region 64a and a second high-concentration drift region 64b.

The n-type impurity concentration of the first high-concentration drift region 64a and the second high-concentration drift region 64b is higher than the n-type impurity concentration of the drift region 24. The n-type impurity concentration of the first high-concentration drift region 64a and the second high-concentration drift region 64b is, for example, equal to or greater than two times the n-type impurity concentration of the drift region 24.

According to the MOSFET 200, the electric resistance of a region which is interposed between the first gate insulating layer 16a and the electric field reducing region 34 and a region which is interposed between the second gate insulating layer 16b and the electric field reducing region 34 is low. Therefore, on-resistance is lower than that in the MOSFET 100.

As described above, according to this embodiment, the maximum electric field strength of the first gate insulating layer 16a and the second gate insulating layer 16b is reduced and the MOSFET 100 that can improve the breakdown voltage of the gate insulating layer is achieved. In addition, it is possible to improve the breakdown voltage of the gate insulating layer and to reduce on-resistance. It is possible to achieve the MOSFET 100 with high secondary breakdown resistance. Furthermore, according to this embodiment, it is possible to achieve the MOSFET 100 with low manufacturing costs. It is possible to achieve the MOSFET 100 in which a variation in characteristics due to a manufacturing variation is small and characteristics are stabilized.

Second Embodiment

A semiconductor device according to this embodiment is the same as the semiconductor device according to the first embodiment except that it further includes an eight silicon carbide layer of a second conductivity type which is provided between the first gate insulating layer and the first silicon carbide region and a ninth silicon carbide layer of the second conductivity type which is provided between the second gate insulating layer and the first silicon carbide region. Therefore, the description of the same content as that in the first embodiment will not be repeated.

Figure 17:
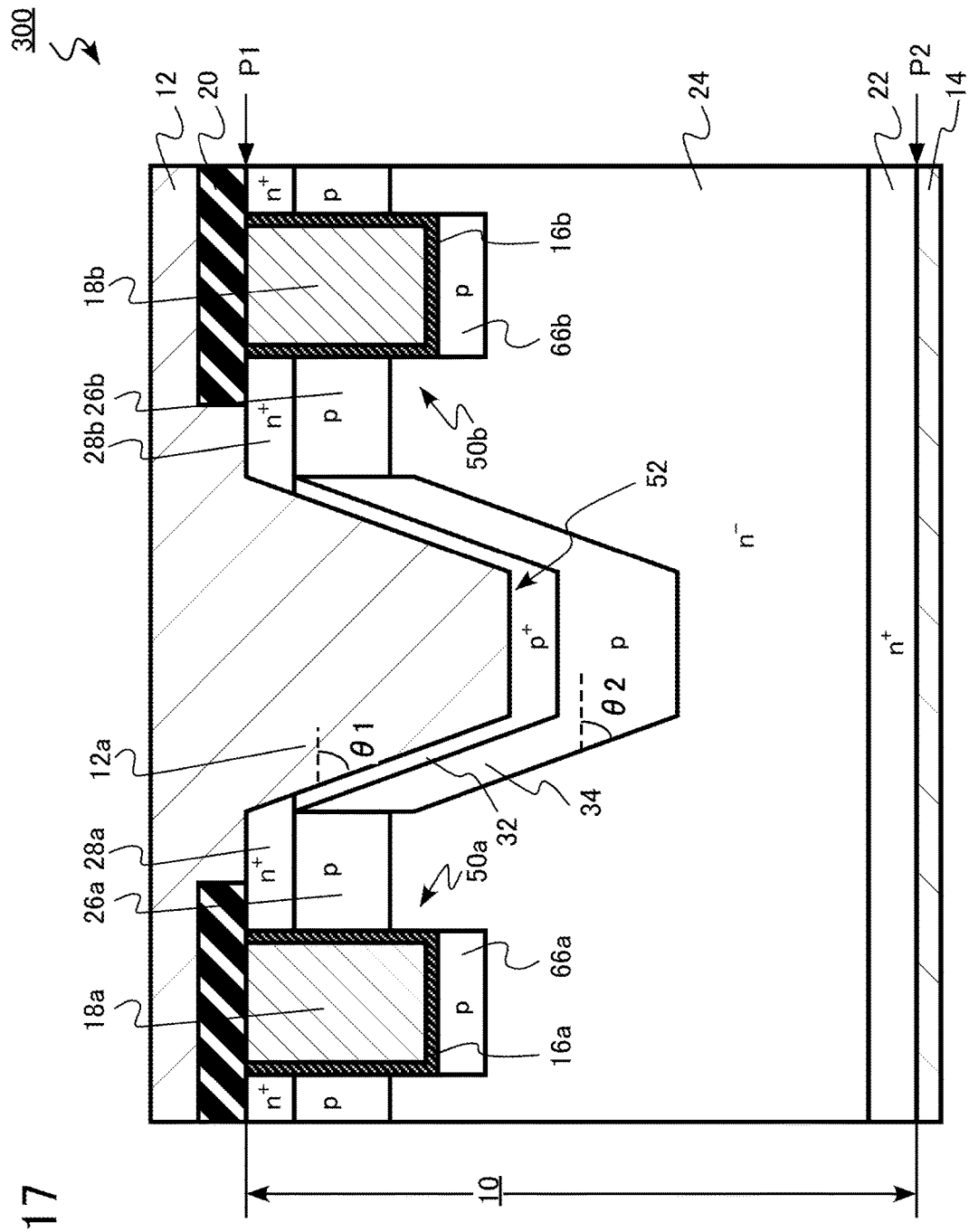
FIG. 17 is a cross-sectional view schematically illustrating a semiconductor device according to a second embodiment.

FIG. 17 is a cross-sectional view schematically illustrating the semiconductor device according to this embodiment.

A MOSFET 300 according to this embodiment includes a first p-type region 66a and a second p-type region 66b.

The first p-type region 66a is provided between the first gate insulating layer 16a and the drift region 24. The first p-type region 66a is provided so as to come into contact with the bottom of the first gate trench 50a. The first p-type region 66a is separated from the first p well region 26a.

The second p-type region 66b is provided between the second gate insulating layer 16b and the drift region 24. The second p-type region 66b is provided so as to come into contact with the bottom of the second gate trench 50b. The second p-type region 66b is separated from the second p well region 26b.

According to this embodiment, the MOSFET 300 having the same effect as that in the first embodiment is achieved. Since the MOSFET 300 includes the first p-type region 66a and the second p-type region 66b, the maximum electric field strength of the first gate insulating layer 16a and the second gate insulating layer 16b is further reduced. Therefore, the MOSFET 300 that can further improve the breakdown voltage of the gate insulating layer as compared to the first embodiment is achieved.

Third Embodiment

A semiconductor device according to this embodiment is the same as the semiconductor device according to the first embodiment except that the thickness of the first gate insulating layer between the first gate electrode and the first p well region is less than the thickness of the first gate insulating layer between the first gate electrode and the first silicon carbide region and the thickness of the second gate insulating layer between the second gate electrode and the second p well region is less than the thickness of the second gate insulating layer between the second gate electrode and the first silicon carbide region. Therefore, the description of the same content as that in the first embodiment will not be repeated.

Figure 18:
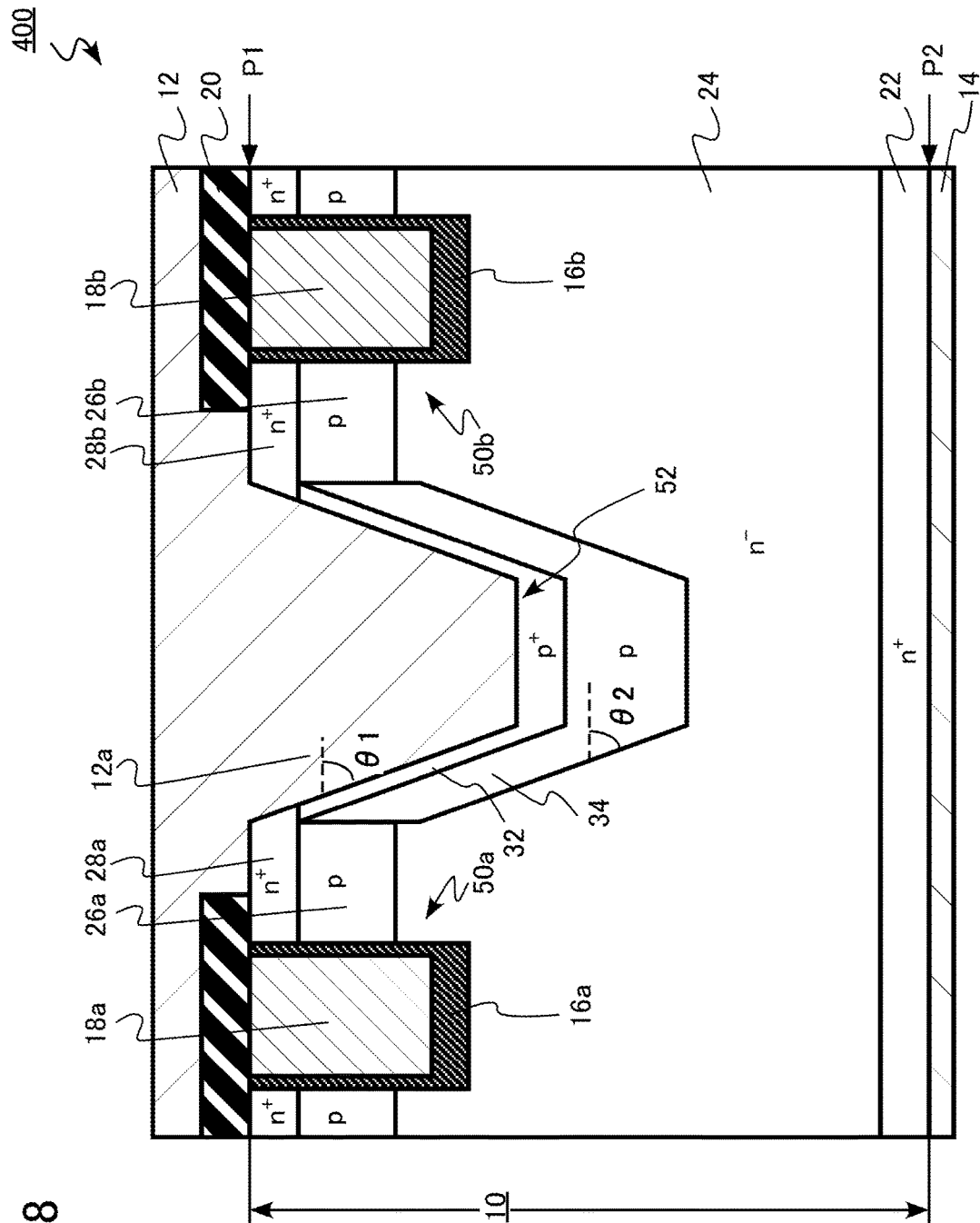
FIG. 18 is a cross-sectional view schematically illustrating a semiconductor device according to a third embodiment.

FIG. 18 is a cross-sectional view schematically illustrating the semiconductor device according to this embodiment.

In a MOSFET 400 according to this embodiment, the thickness of the first gate insulating layer 16a between the first gate electrode 18a and the first p well region 26a is less than the thickness of the first gate insulating layer 16a between the first gate electrode 18a and the drift region (first silicon carbide region) 24. In other words, the first gate insulating layer 16a on the bottom of the first gate trench 50a is thicker than the first gate insulating layer 16a on the side surface of the first gate trench 50a.

In addition, the thickness of the second gate insulating layer 16b between the second gate electrode 18b and the second p well region 26b is less than the thickness of the second gate insulating layer 16b between the second gate electrode 18b and the drift region (first silicon carbide region) 24. In other words, the second gate insulating layer 16b on the bottom of the second gate trench 50b is thicker than the second gate insulating layer 16b on the side surface of the second gate trench 50b.

According to this embodiment, the MOSFET 400 having the same effect as that in the first embodiment is achieved. Since the first gate insulating layer 16a and the second gate insulating layer 16b which are provided on the bottoms of the first gate trench 50a and the second gate trench 50b, respectively, are thick, the maximum electric field strength of the first gate insulating layer 16a and the second gate insulating layer 16b is further reduced. Therefore, the MOSFET 400 that can further improve the breakdown voltage of the gate insulating layer as compared to the first embodiment is achieved.

Fourth Embodiment

An inverter circuit and a driving device according to this embodiment includes the semiconductor device according to the first embodiment.

Figure 19:
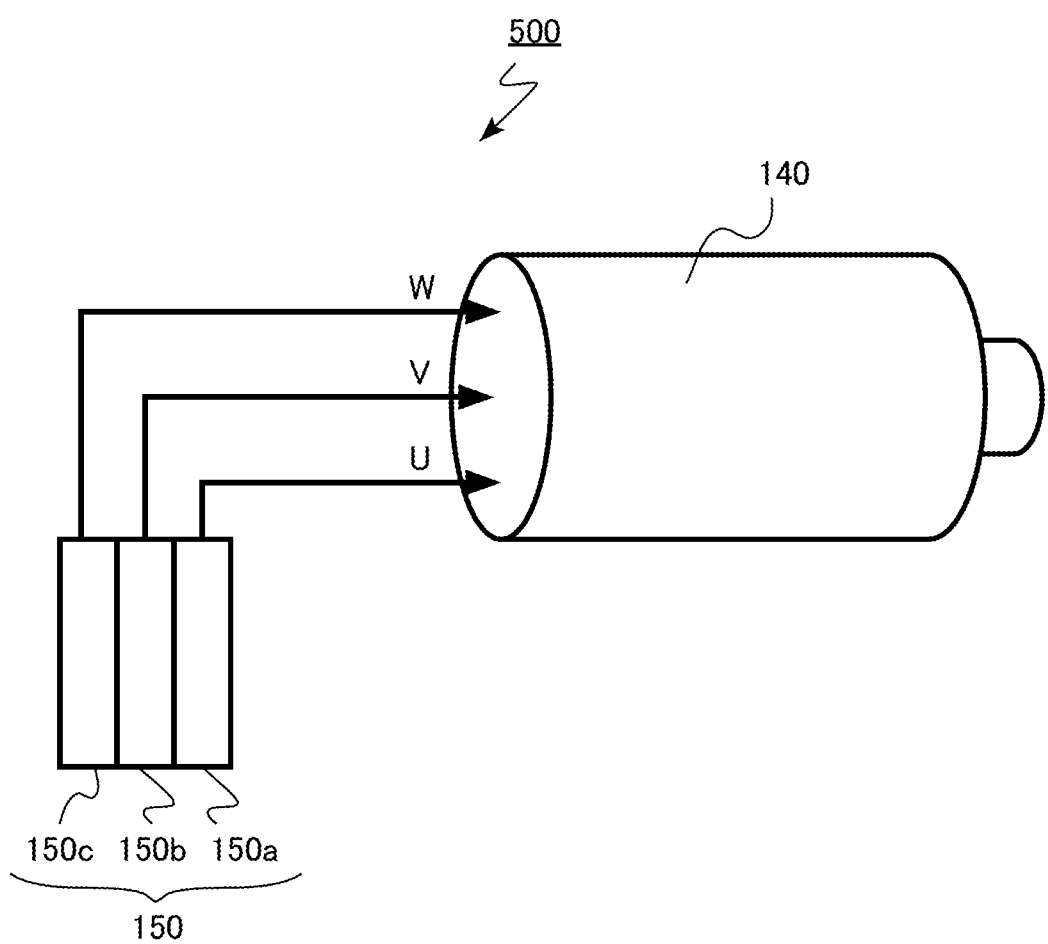
FIG. 19 is a diagram schematically illustrating a driving device according to a fourth embodiment.

FIG. 19 is a diagram schematically illustrating the driving device according to this embodiment. A driving device 500 includes a motor 140 and an inverter circuit 150.

The inverter circuit 150 includes three semiconductor modules 150a, 150b, and 150c having the MOSFET 100 according to the first embodiment as a switching element. The three semiconductor modules 150a, 150b, and 150c are connected in parallel to each other to form the three-phase inverter circuit 150 including three AC voltage output terminals U, V, and W. The motor 140 is drive by an AC voltage which is output from the inverter circuit 150.

According to this embodiment, since the inverter circuit includes the MOSFET 100 with improved characteristics, it is possible to improve the characteristics of the inverter circuit 150 and the driving device 500.

Fifth Embodiment

A vehicle according to this embodiment includes the semiconductor device according to the first embodiment.

Figure 20:
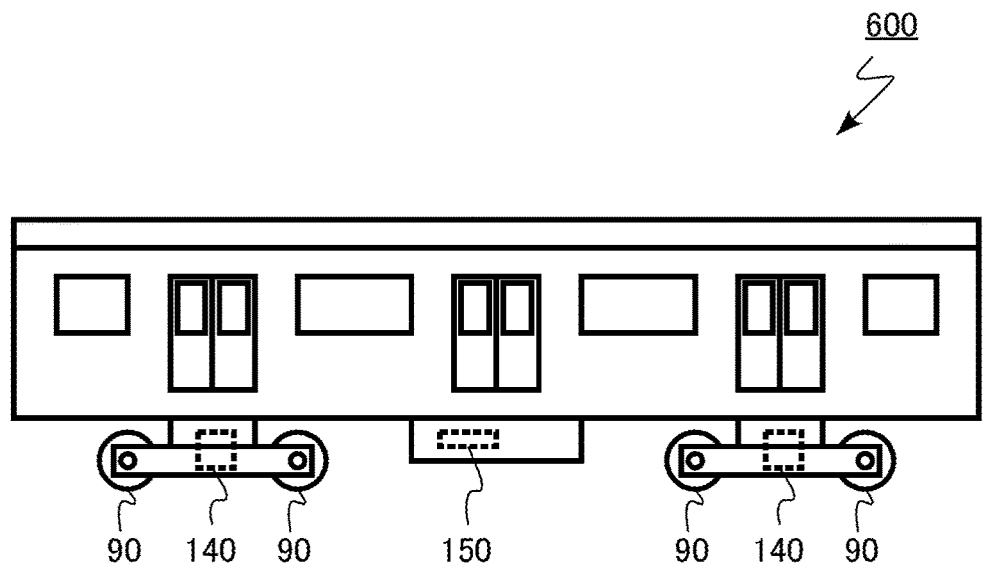
FIG. 20 is a diagram schematically illustrating a vehicle according to a fifth embodiment.

FIG. 20 is a diagram schematically illustrating the vehicle according to this embodiment. A vehicle 600 according to this embodiment is a railway vehicle. The vehicle 600 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W. The motor 140 is driven by an AC voltage which is output from the inverter circuit 150. Wheels 90 of the vehicle 600 are rotated by the motor 140.

According to this embodiment, since the vehicle 600 includes the MOSFET 100 with improved characteristics, the characteristics of the vehicle 600 are improved.

Sixth Embodiment

A vehicle according to this embodiment includes the semiconductor device according to the fifth embodiment.

Figure 21:
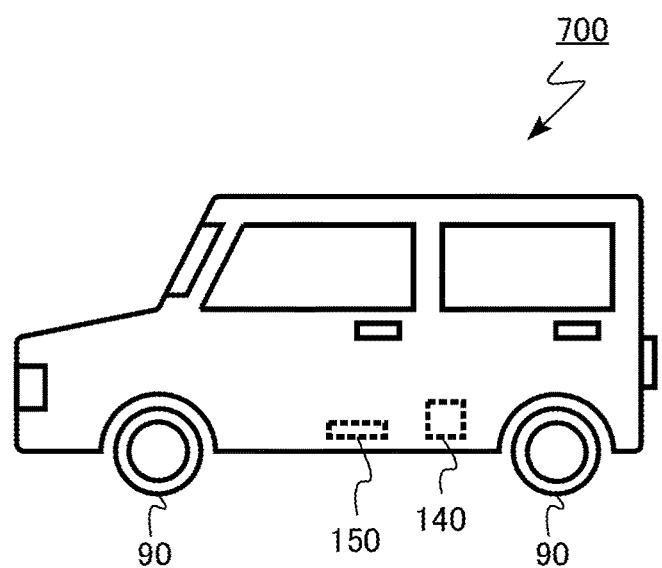
FIG. 21 is a diagram schematically illustrating a vehicle according to a sixth embodiment.

FIG. 21 is a diagram schematically illustrating the vehicle according to this embodiment. A vehicle 700 according to this embodiment is a car. The vehicle 700 includes a motor 140 and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. Wheels 90 of the vehicle 700 are rotated by the motor 140.

According to this embodiment, since the vehicle 700 includes the MOSFET 100 with improved characteristics, the characteristics of the vehicle 700 are improved.

Seventh Embodiment

An elevator according to this embodiment includes the semiconductor device according to the first embodiment.

Figure 22:
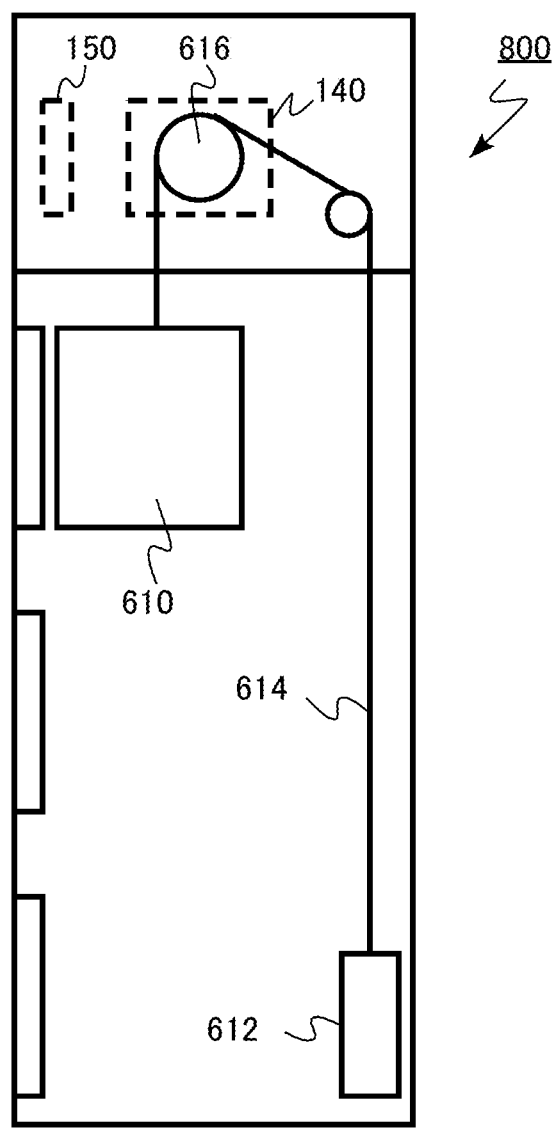
FIG. 22 is a diagram schematically illustrating an elevator according to a seventh embodiment.

FIG. 22 is a diagram schematically illustrating the elevator according to this embodiment. An elevator 800 according to this embodiment includes a basket 610, a counter weight 612, a wire rope 614, a hoist 616, a motor 140, and an inverter circuit 150.

The inverter circuit 150 includes three semiconductor modules having the MOSFET 100 according to the first embodiment as a switching element. The three semiconductor modules are connected in parallel to each other to form the three-phase inverter circuit 150 having three AC voltage output terminals U, V, and W.

The motor 140 is driven by an AC voltage which is output from the inverter circuit 150. The hoist 616 is rotated by the motor 140 to move up and down the basket 610.

According to this embodiment, since the elevator 800 includes the MOSFET 100 with improved characteristics, the characteristics of the elevator 800 are improved.

In the first to third embodiments, the MOSFET is given as an example of the semiconductor device. However, the invention may be applied to an insulated gate bipolar transistor (IGBT).

In the first embodiment, an example in which the first conductivity type is an n type and the second conductivity type is a p type has been described. However, the first conductivity type may be a p type and the second conductivity type may be an n type.

In the first to third embodiments, an example in which the SiC layer is made of 4H-SiC has been described above. However, the invention can be applied to other crystal forms such as 3C-SiC and 6H-SiC.

In the first to third embodiments, it is preferable that the n-type impurity be, for example, nitrogen (N) or phosphorus (P). However, the n-type impurity may be, for example, arsenic (As) or antimony (Sb). It is preferable that the p-type impurity be, for example, aluminum (Al). However, the p-type impurity may be, for example, boron (B), gallium (Ga), or indium (In).

In the fourth to sixth embodiments, an example in which the semiconductor device according to the invention is applied to the vehicle or the elevator has been described. However, the semiconductor device according to the invention may be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer having a first plane and a second plane;
a first electrode having a first region provided in the silicon carbide layer, a width of a second-plane-side end portion of the first region being less than a width of a first-plane-side end portion of the first region, a first inclination angle of a side surface of the first region with respect to a plane parallel to the first plane being equal to or greater than 60 degrees and equal to or less than 85 degrees;
a second electrode facing the first electrode, the silicon carbide layer being interposed between the second electrode and the first electrode;
a first gate electrode;
a second gate electrode facing the first gate electrode, the first region being interposed between the second gate electrode and the first gate electrode;
a first gate insulating layer provided between the first region and the first gate electrode;
a second gate insulating layer provided between the first region and the second gate electrode;
a first silicon carbide region of a first conductivity type provided in the silicon carbide layer;
a second silicon carbide region of a second conductivity type provided between the first silicon carbide region and the first plane and between the first region and the first gate insulating layer;
a third silicon carbide region of the second conductivity type provided between the first silicon carbide region and the first plane and between the first region and the second gate insulating layer;
a fourth silicon carbide region of the first conductivity type provided between the second silicon carbide region and the first plane;
a fifth silicon carbide region of the first conductivity type provided between the third silicon carbide region and the first plane and the first region interposed between the fifth silicon carbide region and the fourth silicon carbide region;
a sixth silicon carbide region of the second conductivity type provided between the second-plane-side end portion of the first region and the first silicon carbide region and between the side surface of the first region and the first silicon carbide region and having a higher second-conductivity-type impurity concentration than the second silicon carbide region and the third silicon carbide region; and
a seventh silicon carbide region of the second conductivity type provided between the first silicon carbide region and the sixth silicon carbide region and having a lower second-conductivity-type impurity concentration than the sixth silicon carbide region, a distance between the seventh silicon carbide region and the second plane being less than a distance between the second plane and the second silicon carbide region and a distance between the second plane and the third silicon carbide region.

2. The semiconductor device according to claim 1, wherein a second-conductivity-type impurity concentration of the seventh silicon carbide region is higher than a second-conductivity-type impurity concentration of the second silicon carbide region and the third silicon carbide region.

3. The semiconductor device according to claim 2, wherein the second-conductivity-type impurity concentration of the seventh silicon carbide region is equal to or greater than two times the second-conductivity-type impurity concentration of the second silicon carbide region and the third silicon carbide region.

4. The semiconductor device according to claim 1, wherein the distance between the second plane and the seventh silicon carbide region is less than a distance between the second plane and the first gate insulating layer and a distance between the second plane and the second gate insulating layer.

5. The semiconductor device according to claim 1, wherein the first inclination angle is equal to or greater than 65 degrees and equal to or less than 80 degrees.

6. The semiconductor device according to claim 1, wherein a second inclination angle of a boundary between the seventh silicon carbide region and the first silicon carbide region with respect to the plane parallel to the first plane is equal to or greater than 60 degrees and equal to or less than 85 degrees.

7. The semiconductor device according to claim 6, wherein the second inclination angle is equal to or greater than 65 degrees and equal to or less than 80 degrees.

8. The semiconductor device according to claim 1, wherein the sixth silicon carbide region is in contact with the fourth silicon carbide region and the fifth silicon carbide region.

9. The semiconductor device according to claim 1, wherein a difference between a distance between the first region and the first gate insulating layer and a distance between the seventh silicon carbide region and the first gate insulating layer and a difference between a distance between the first region and the second gate insulating layer and a distance between the seventh silicon carbide region and the second gate insulating layer are equal to or less than 0.1 μm.

10. The semiconductor device according to claim 1, wherein a distance between a first contact point between the first plane and the side surface of the first region close to the first gate insulating layer and the first gate insulating layer and a distance between a second contact point between the first plane and the side surface of the first region close to the second gate insulating layer and the second gate insulating layer are equal to or greater than 0.1 μm and equal to or less than 0.8 μm.

11. The semiconductor device according to claim 1, wherein a distance between a first contact point between the first plane and the side surface of the first region close to the first gate insulating layer and the first gate insulating layer and a distance between a second contact point between the first plane and the side surface of the first region close to the second gate insulating layer and the second gate insulating layer are equal to or greater than 0.3 μm and equal to or less than 0.6 μm.

12. The semiconductor device according to claim 1, wherein the first gate insulating layer and the second gate insulating layer includes silicon oxide.

13. An inverter circuit comprising:
the semiconductor device according to claim 1.

14. A driving device comprising:
the semiconductor device according to claim 1.

15. A vehicle comprising:
the semiconductor device according to claim 1.

16. An elevator comprising:
the semiconductor device according to claim 1.

17. A method for manufacturing a semiconductor device comprising:
forming a second region of a second conductivity type in a silicon carbide layer including a first region of a first conductivity type and having a first plane and a second plane;
forming two first trenches in the first plane of the silicon carbide layer so as to be deeper than the second region;
forming a second trench in the first plane of the silicon carbide layer between the two first trenches, using a mask member covering the two first trenches as a mask, such that the second trench is deeper than the second region and an inclination angle of a side surface of the second trench with respect to the first plane is equal to or greater than 60 degrees and equal to or less than 85 degrees;
implanting ions in the silicon carbide layer from the side and bottom of the second trench at an angle of 1 degree or less with respect to a line normal to the first plane to forma third region of the second conductivity type;
implanting ions in the silicon carbide layer from the side and bottom of the second trench at an angle of 1 degree or less with respect to the line normal to the first plane to form a fourth region of the second conductivity type shallower than the third region and having a higher second-conductivity-type impurity concentration than the third region;
forming gate insulating layers in the first trenches;
forming gate electrodes on the gate insulating layers in the first trenches;
forming a first electrode filling the second trench; and
forming a second electrode on the second plane.

18. The method according to claim 17, wherein the third region has a higher second-conductivity-type impurity concentration than the second region.

19. The method according to claim 17, wherein a depth of the second trench is greater than a depth of the first trenches.

* * * * *